United States Patent
Liou et al.

(10) Patent No.: US 12,376,309 B2
(45) Date of Patent: Jul. 29, 2025

(54) FERROELECTRIC MEMORY DEVICE AND METHOD OF FORMING THE SAME

(71) Applicant: Taiwan Semiconductor Manufacturing Company, Ltd., Hsinchu (TW)

(72) Inventors: Peng-Chun Liou, Tainan (TW); Zhiqiang Wu, Hsinchu County (TW); Chung-Wei Wu, Hsin-Chu County (TW); Ya-Yun Cheng, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 599 days.

(21) Appl. No.: 17/572,623

(22) Filed: Jan. 10, 2022

(65) Prior Publication Data

US 2023/0225130 A1 Jul. 13, 2023

(51) Int. Cl.
*H10B 51/20* (2023.01)
*H10B 51/10* (2023.01)
*H10B 51/30* (2023.01)

(52) U.S. Cl.
CPC ............ *H10B 51/20* (2023.02); *H10B 51/10* (2023.02); *H10B 51/30* (2023.02)

(58) Field of Classification Search
CPC ........ H10B 51/00; H10B 51/10; H10B 51/20; H10B 51/30
See application file for complete search history.

(56) References Cited

U.S. PATENT DOCUMENTS

| | | | |
|---|---|---|---|
| 2021/0050372 A1* | 2/2021 | Sharangpani | H10B 43/35 |
| 2021/0296332 A1* | 9/2021 | Han | H10B 41/27 |
| 2021/0335820 A1* | 10/2021 | Kang | G11C 15/04 |
| 2021/0375938 A1* | 12/2021 | Lin | H10B 51/30 |
| 2023/0023327 A1* | 1/2023 | Nagashima | H10B 51/20 |

FOREIGN PATENT DOCUMENTS

| | | | | |
|---|---|---|---|---|
| CN | 113948531 A | * | 1/2022 | ........ H01L 27/11587 |
| WO | WO-2022260708 A1 | * | 12/2022 | ........ H01L 27/11519 |

\* cited by examiner

*Primary Examiner* — Matthew E Warren
(74) *Attorney, Agent, or Firm* — JCIPRNET

(57) ABSTRACT

A ferroelectric memory device includes a multi-layer stack, a ferroelectric layer, and channel layers. The multi-layer stack is disposed on a substrate and includes conductive layers and dielectric layers stacked alternately. The ferroelectric layer has a curvy profile and is disposed along sidewalls of the conducive layers and sidewalls of the dielectric layers. The channel layers are separated from each other and disposed on the ferroelectric layer, and correspond to the conductive layers respectively.

20 Claims, 26 Drawing Sheets

FERROELECTRIC MEMORY DEVICE AND METHOD OF FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various material layers using lithography and etching techniques to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
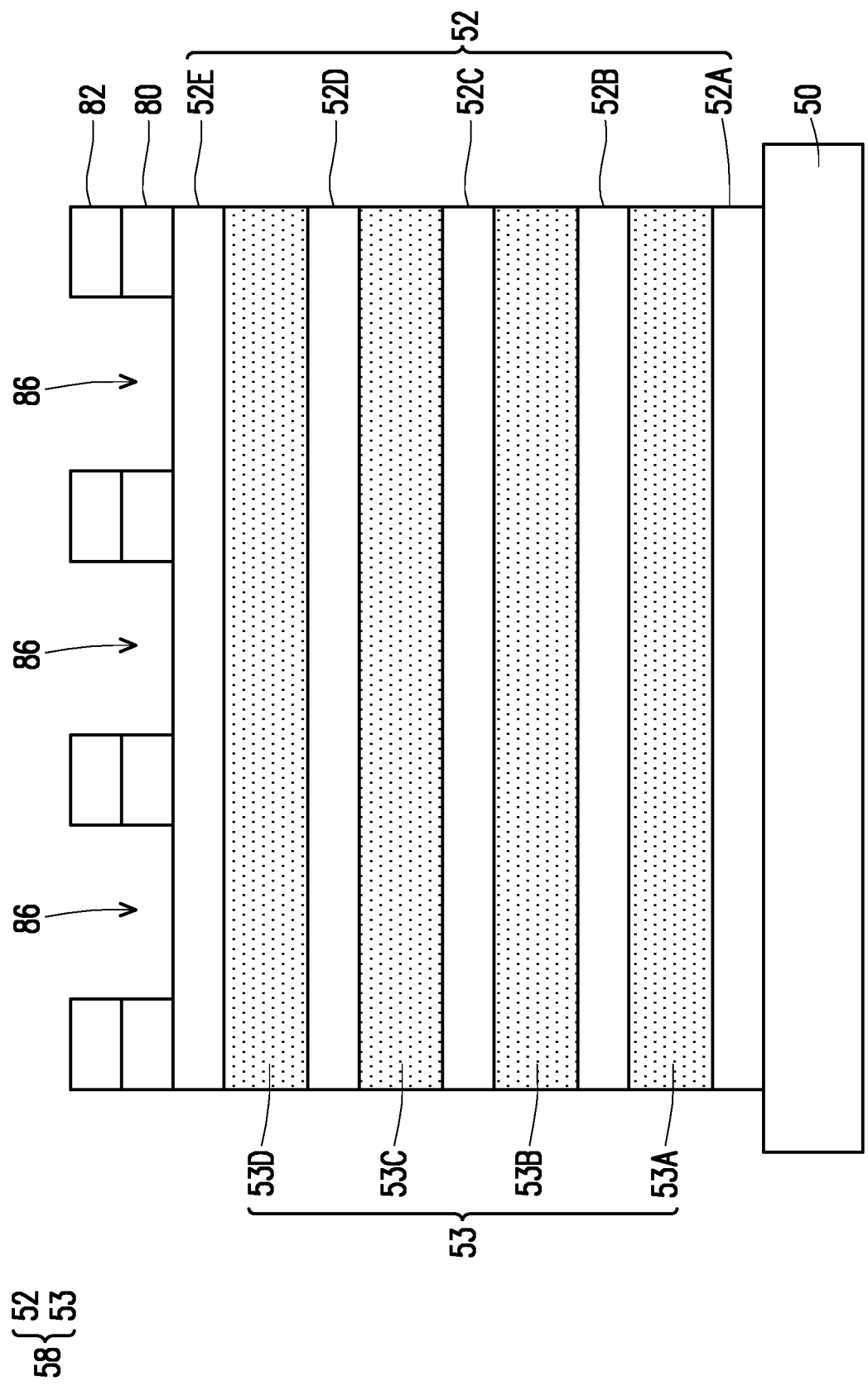
FIGS. 1, 2, 3A, 3B, 4A, 4B, 5, 6, 7, 8, 9A, 9B and 9C illustrate varying views of manufacturing a ferroelectric memory device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide a memory device such as a 3D memory array. In some embodiments, the 3D memory array is a ferroelectric field effect transistor (FeFET) memory circuit including a plurality of vertically stacked memory cells. In some embodiments, each memory cell is regarded as a FeFET that includes a word line region acting as a gate electrode, a bit line region acting as a first source/drain electrode, and a source line region acting as a second source/drain electrode, a ferroelectric material as a gate dielectric, and an oxide semiconductor (OS) as a channel layer. In some embodiments, each memory cell is regarded as a thin film transistor (TFT).

In the disclosure, the channel regions of the memory array are provided at gated regions only while removed from ungated regions. Therefore, the leakage current of such memory array is significantly reduced.

FIGS. 1, 2, 3A, 3B, 4A, 4B, 5, 6, 7, 8, 9A, 9B and 9C illustrate varying views of manufacturing a ferroelectric memory device in accordance with some embodiments.

Referring to FIG. 1, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be an integrated circuit die, such as a logic die, a memory die, an ASIC die, or the like. The substrate 50 may be a complementary metal oxide semiconductor (CMOS) die and may be referred to as a CMOS under array (CUA). In some embodiments, the substrate 50 includes transistors at a top surface of the substrate 50. The transistors may include fin field effect transistors (FinFETs), nanostructure FETS (nano-FETs) (e.g., nanosheet transistors, nanowire transistors or gate-all-around transistors), planar FETs, the like, or combinations thereof, and may be formed by gate-first processes or gate-last processes. In some embodiments, the substrate 50 further includes interconnect structure electrically connected to the transistors. Although the transistors discussed above are formed over the substrate 50, other active devices (e.g., diodes or the like) and/or passive devices (e.g., capacitors, resistors, or the like) may also be formed as part of the functional circuits.

In some embodiments, a bulk multi-layer stack 58 is formed over the substrate 50. In some embodiments, one or more interconnect layers including conductive features in insulting layers (e.g., low-k dielectric layers) may be disposed between the substrate 50 and the multi-layer stack 58. In some embodiments, the conductive features may be patterned to provide power, ground, and/or signal lines for the active devices on the substrate 50 and/or the ferroelectric memory devices (e.g., memory arrays 10/20 in FIGS. 9A and 18A). In some embodiments, one or more interconnect layers including conductive features in insulting layers (e.g., low-k dielectric layers) may be disposed over the multi-layer stack 58.

In FIG. 1, the multi-layer stack 58 includes alternating layers of sacrificial layers 53A-53D (collectively referred to as sacrificial layers 53) and dielectric layers 52A-52E (collectively referred to as dielectric layers 52). The sacrificial layers 53 may be patterned and replaced in subsequent stages to define conductive layers 72 (e.g., the word lines). The sacrificial layers 53 may include dielectric materials, such as silicon oxide, silicon nitride, silicon oxynitride, combinations thereof, or the like. The dielectric layers 52 may include insulating materials, such as silicon oxide, silicon nitride, silicon oxynitride, combinations thereof, or the like. The sacrificial layers 53 and the dielectric layers 52 include different materials with different etching selectivities. In some embodiments, the sacrificial layers 53 include silicon nitride, and the dielectric layers 52 include silicon oxide. Each of the sacrificial layers 53 and the dielectric layers 52 may be formed using, for example, chemical vapor deposition (CVD), atomic layer deposition (ALD), physical vapor deposition (PVD), plasma enhanced CVD (PECVD), or the like.

Although FIG. 1 illustrates a particular number of the sacrificial layers 53 and the dielectric layers 52, other embodiments may include different numbers of the sacrificial layers 53 and the dielectric layers 52. Besides, although the multi-layer stack 58 is illustrated as having dielectric layers as topmost and bottommost layers, the disclosure is not limited thereto. In some embodiments, at least one of the topmost and bottommost layers of the multi-layer stack 58 is a sacrificial layer.

Figure 2:
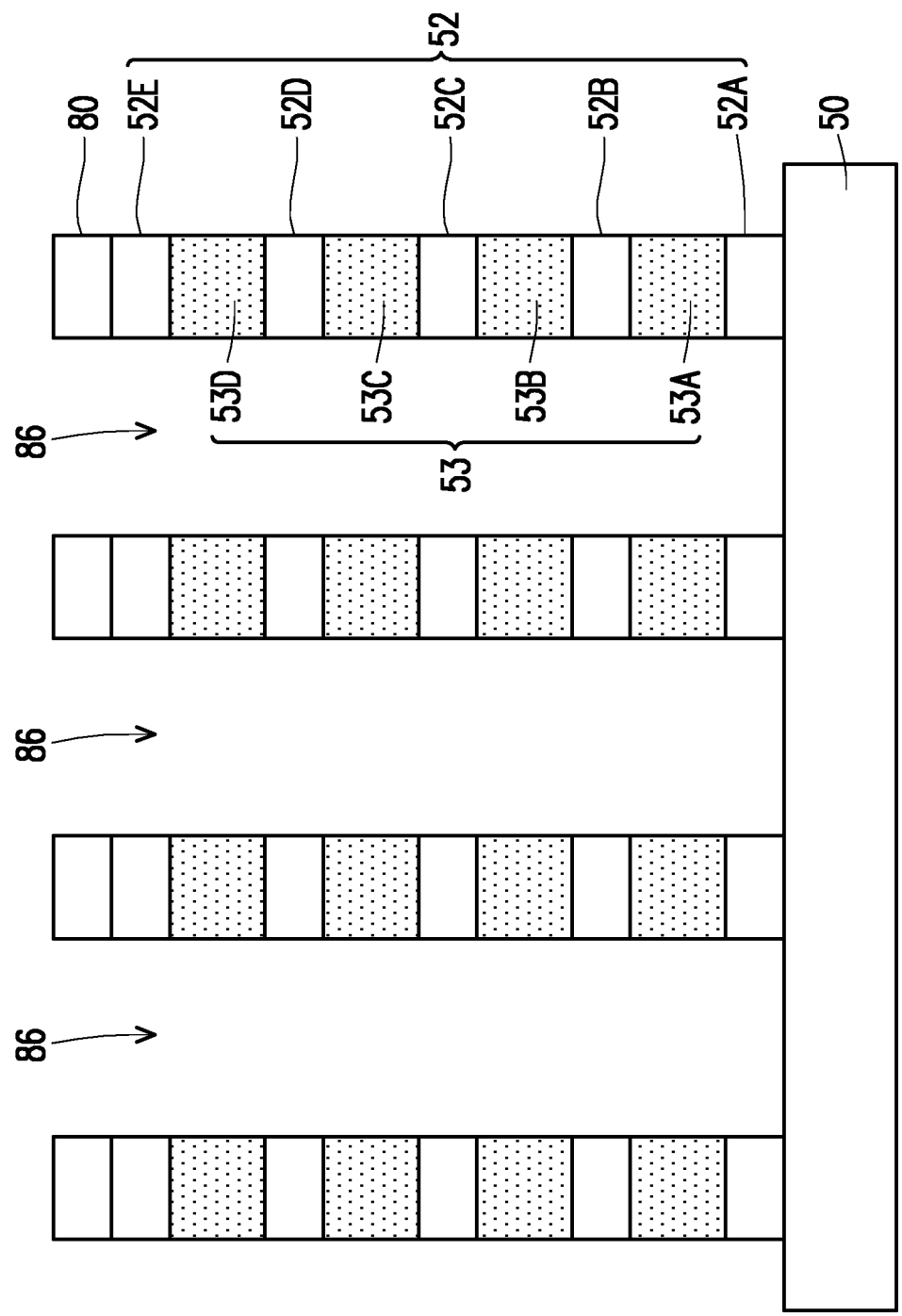

Referring to FIG. 1 and FIG. 2, photoresist patterns 82 and underlying hard mask patterns 80 are formed over the multi-layer stack 58. In some embodiments, a hard mask layer and a photoresist layer are sequentially formed over the multi-layer stack 58. The hard mask layer may include, for example, silicon nitride, silicon oxynitride, or the like, which may be deposited by CVD, PVD, ALD, PECVD, or the like. The photoresist layer is formed by a spin-on technique, for example.

Thereafter, the photoresist layer is patterned to form photoresist patterns 82 and trenches 86 between the photoresist patterns 82. The photoresist layer is patterned by a photolithography technique, for example. The patterns of the photoresist patterns 82 are then transferred to the hard mask layer to form hard mask patterns 80 by using an acceptable etching process. The etching may be anisotropic. Thus, trenches 86 are formed extending through the hard mask layer. Thereafter, the photoresist 82 may be optionally removed by an ashing process, for example.

Figure 3A:
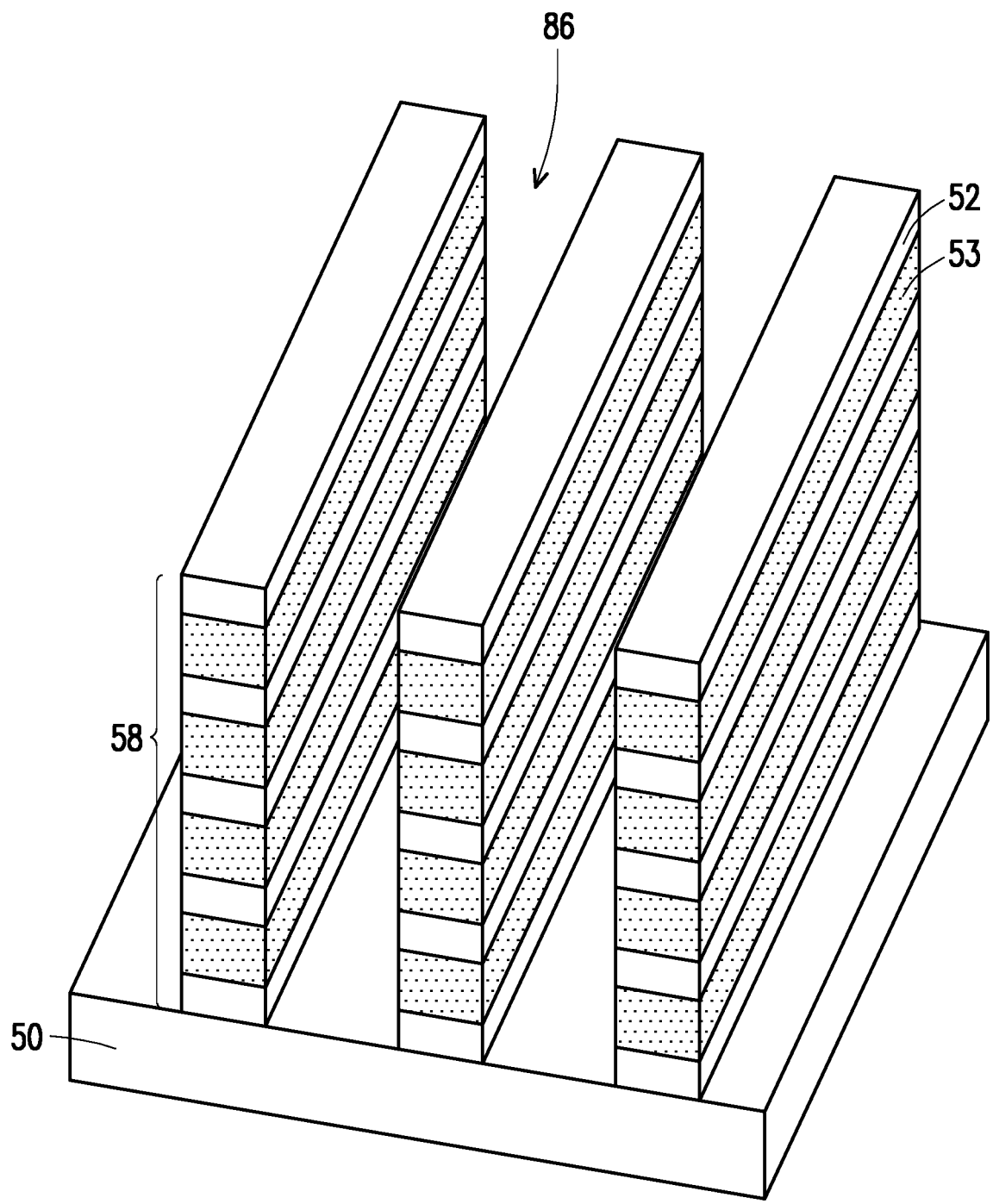
Figure 3B:
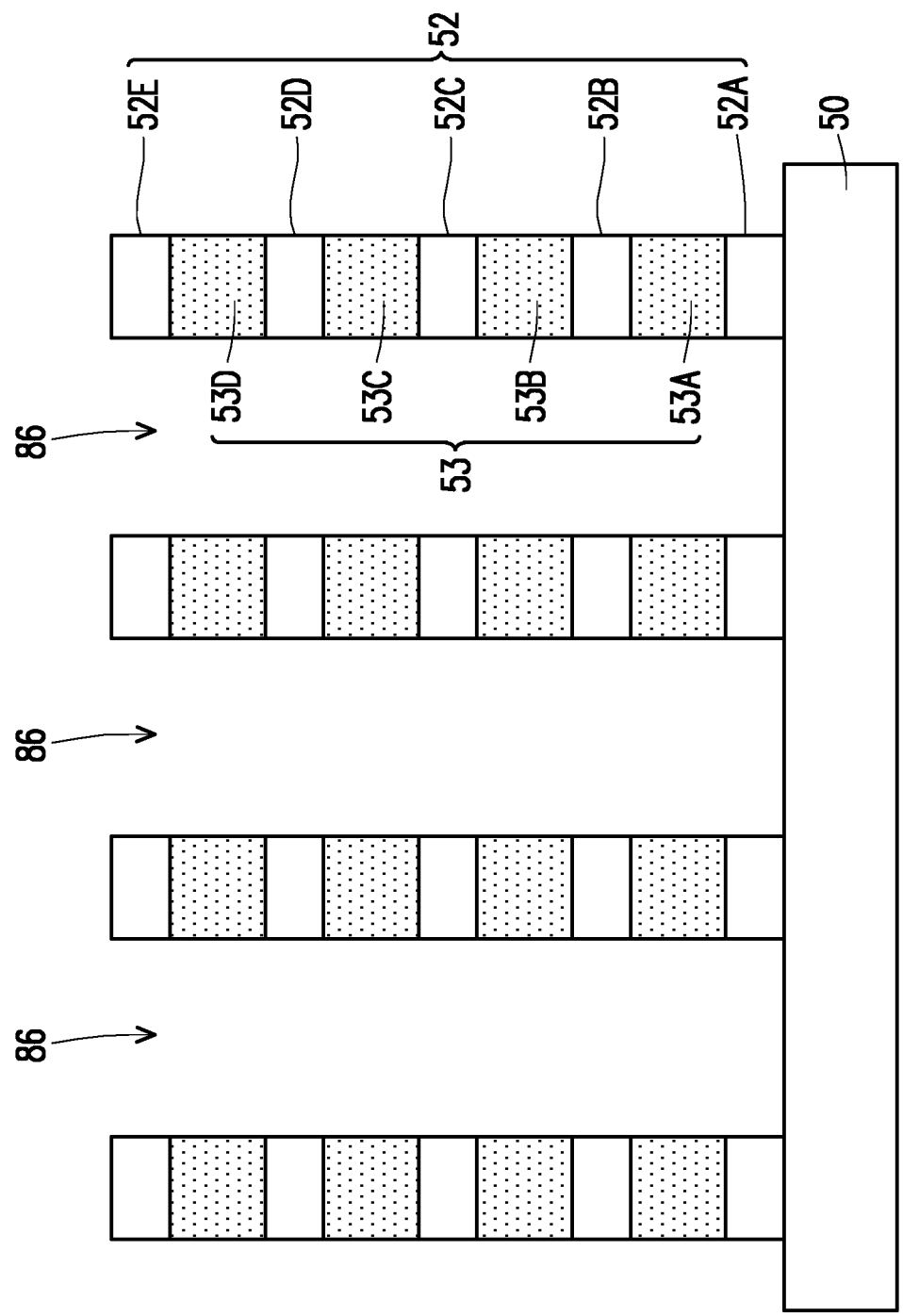

Referring to FIG. 2, FIG. 3A and FIG. 3B, the patterns of the hard mask patterns 80 are transferred to the multi-layer stack 58 using one or more etching processes. The etching processes may be anisotropic. Thus, the trenches 86 extend through the bulk multi-layer stack 58, and strip-shaped sacrificial layers 53 and strip-shaped dielectric layers 52 are accordingly defined. The hard mask patterns 80 may be then removed by an etching process.

Referring to FIG. 3A, FIG. 3B, FIG. 4A and FIG. 4B, the sacrificial layers 53A-53D (collectively referred to as sacrificial layers 53) are replaced with conductive layers 72A-72D (collectively referred to as conductive layers 72). In some embodiments, the sacrificial layers 53 are removed by an etching process. Thereafter, conductive layers 72 are filled into the space between adjacent dielectric layers 52. The replacement process includes performing suitable combination of deposition and etching operations. In some embodiments, each conductive layer 72 includes a metal layer 73 (e.g., W, Ru, Co, Cu, Al, Ni, Au, Ag etc.) surrounded by a barrier layer 71 (e.g., Ti, TiN, Ta, TaN, etc.), and the barrier layer 71 is exposed to the adjacent trenches 86. In other embodiments, a metal layer 73 is sandwiched by upper and lower barrier layers 71, and the sidewall of the metal layer 73 is exposed to the adjacent trench 86.

Figure 4A:
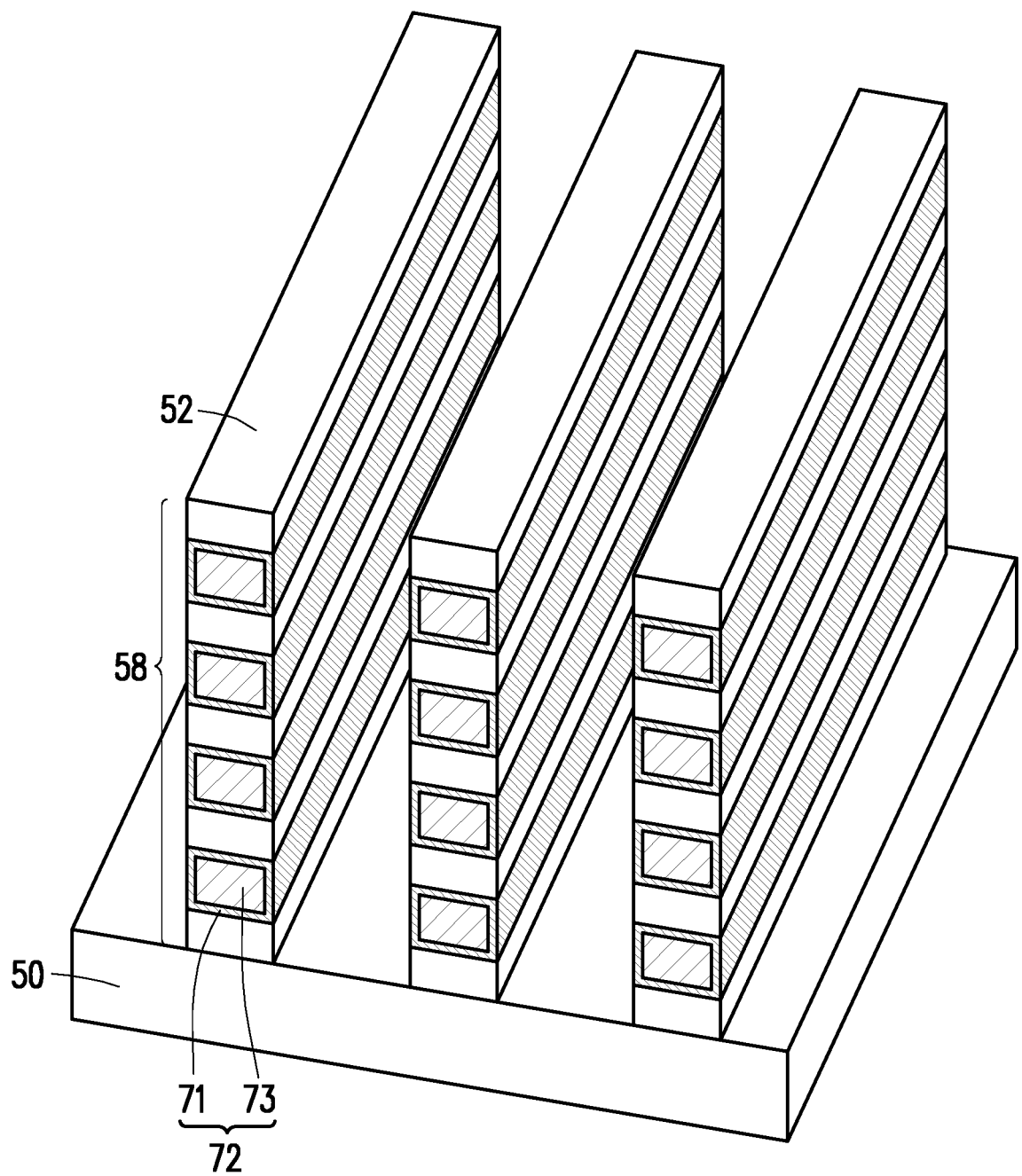
Figure 4B:
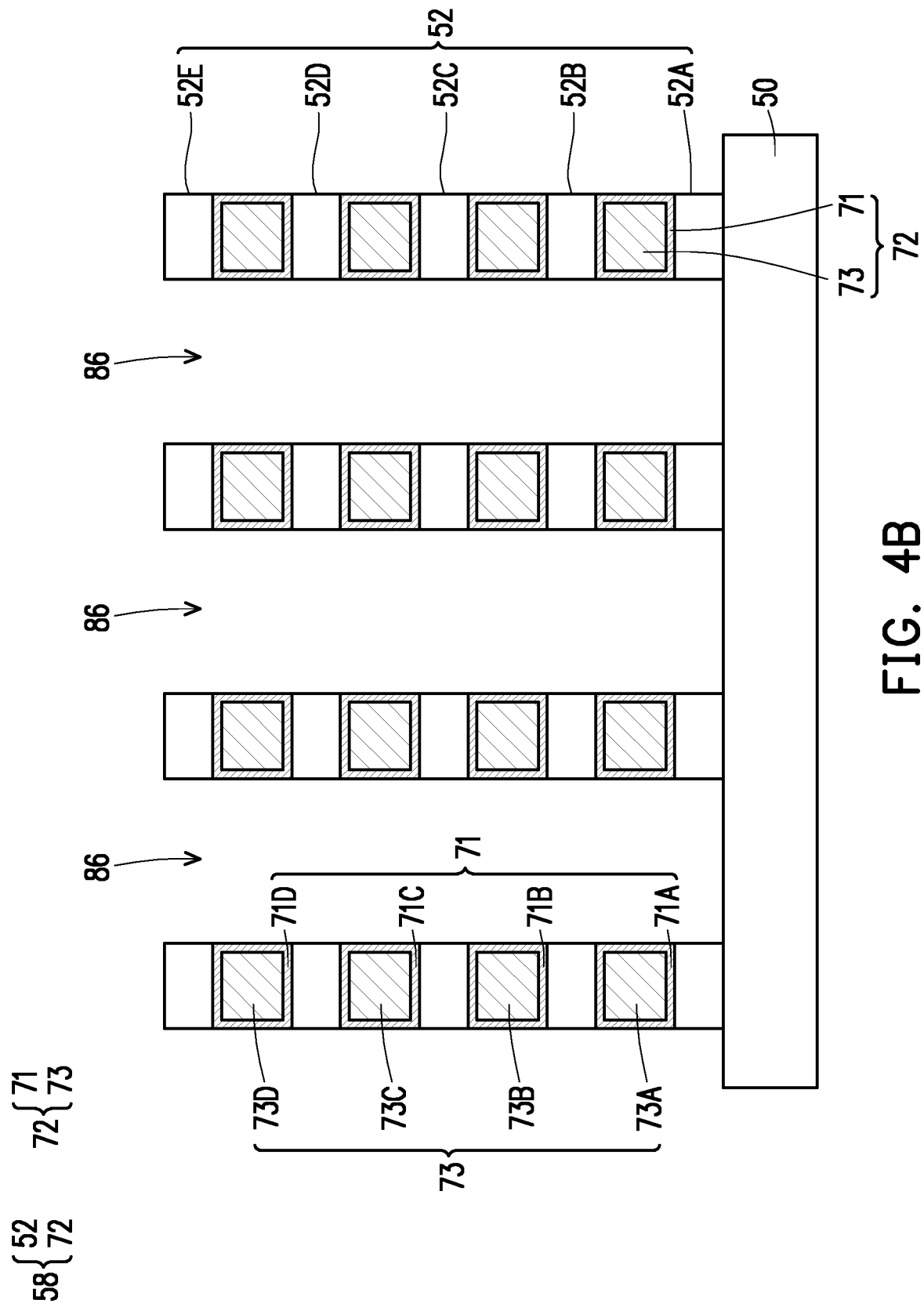

Referring to FIG. 4A and FIG. 4B, upon the replacement process, the conductive layers 72A-72D (collectively referred to as conductive layers 72) include the barrier layers 71A-71D (collectively referred to as barrier layers 71) and the metal layers 73A-73D (collectively referred to as metal layers 73).

Figure 5:
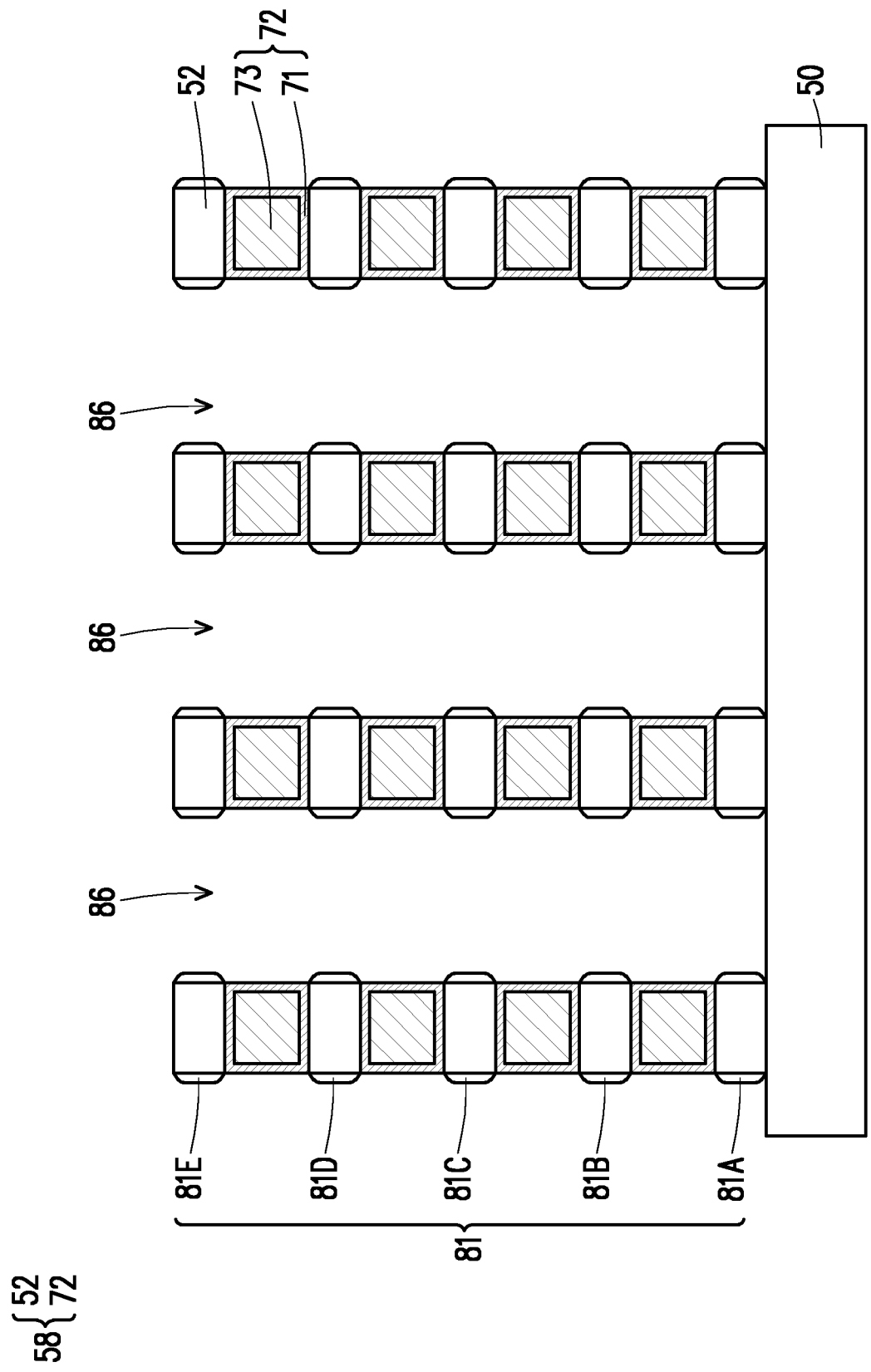

Referring to FIG. 5, cap layers 81A-81E (collectively referred to as cap layers 81) are formed on the sidewalls of the dielectric layers 52 exposed by the trenches 86. In some embodiments, the operation of forming the cap layers 81 includes performing a selective growth process, such as a selective chemical vapor deposition (selective CVD) process, a selective atomic layer deposition (selective ALD) process or the like. In some embodiments, the cap layers 81 include silicon-containing material, such as silicon oxide ($SiO_2$), silicon oxynitride (SiON), silicon oxycarbide (SiOC), the like or a combination thereof. In some embodiments, the cap layers 81 have a thickness of about 1-15 nm, such as 5-10 nm. Other thickness ranges (e.g., more than 15 nm) may be applicable.

When the reaction temperature and the reaction gas are appropriately selected, the cap layers 81 are selectively formed on the dielectric layers 52, rather than on the conductive layers 72. In some embodiments, the cap layers 81 are selectively formed merely on the dielectric layers 52. In other embodiments, the cap layers 81 are further formed to cover a portion of the adjacent conductive layers 52.

Figure 6:
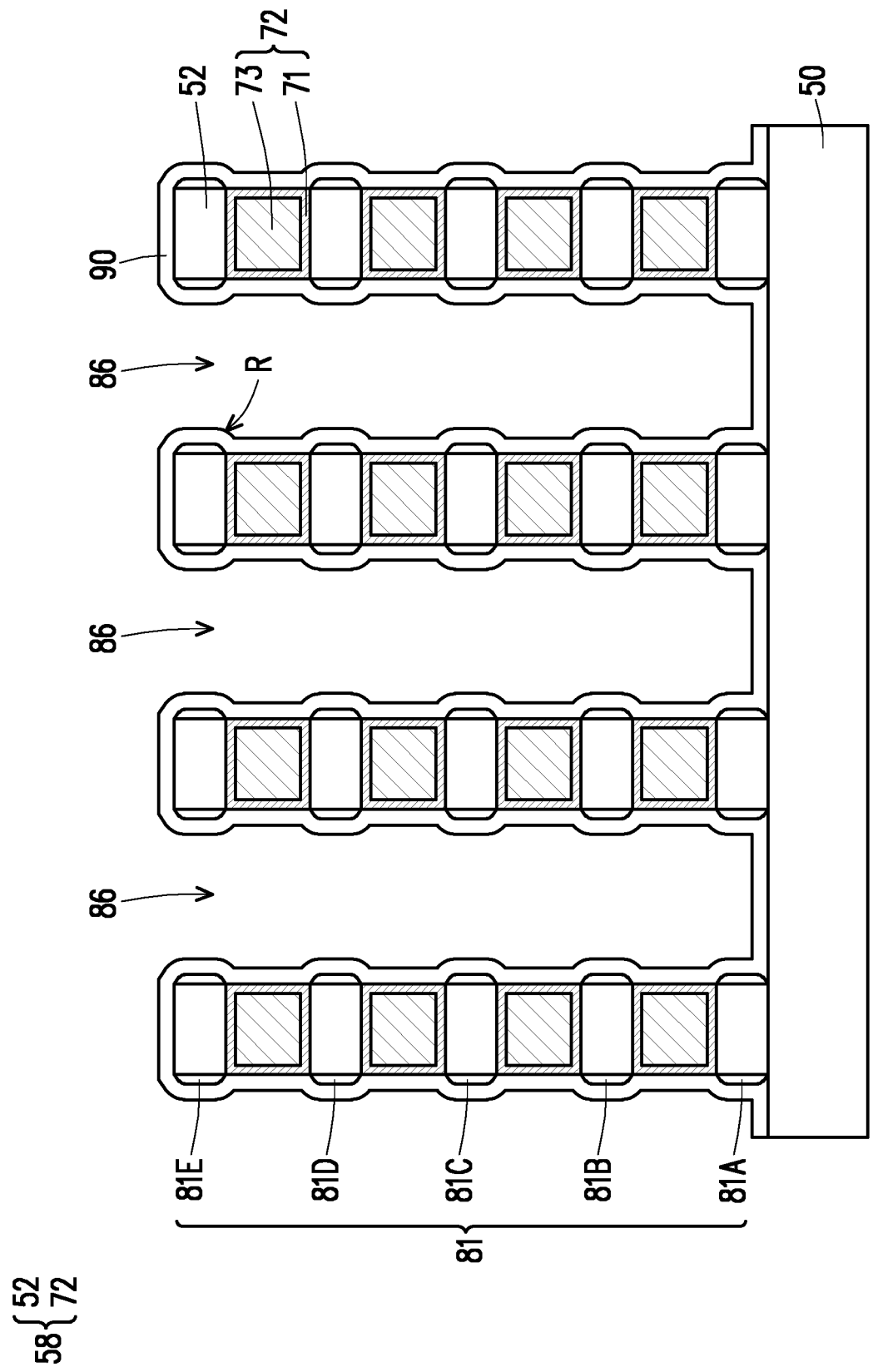

Referring to FIG. 6, a ferroelectric layer 90 is formed on the sidewalls of the cap layers 81 and sidewalls of the conductive layers 72. The ferroelectric layer 90 may be deposited conformally in the trenches 86 along sidewalls of the dielectric layers 52 and the cap layers 81, along top surfaces of the dielectric layer 52E, and along the bottom surfaces of the trenches 86. The ferroelectric layer 90 may include materials that are capable of switching between two different polarization directions by applying an appropriate voltage differential across the ferroelectric layer 90. For example, the ferroelectric layer 90 includes a high-k dielectric material, such as a hafnium (Hf) based dielectric materials or the like. In some embodiments, the ferroelectric layer 90 includes hafnium oxide, hafnium zirconium oxide, silicon-doped hafnium oxide, or the like.

In some embodiments, the ferroelectric layer 90 may include barium titanium oxide ($BaTiO_3$), lead titanium oxide ($PbTiO_3$), lead zirconium oxide ($PbZrO_3$), lithium niobium oxide ($LiNbO_3$), sodium niobium oxide ($NaNbO_3$), potassium niobium oxide ($KNbO_3$), potassium tantalum oxide ($KTaO_3$), bismuth scandium oxide ($BiScO_3$), bismuth iron oxide ($BiFeO_3$), hafnium erbium oxide ($Hf_{1-x}Er_xO$), hafnium lanthanum oxide ($Hf_{1-x}La_xO$), hafnium yttrium oxide ($Hf_{1-x}Ti_xO$), hafnium gadolinium oxide ($Hf_{1-x}Gd_xO$), hafnium aluminum oxide ($Hf_{1-x}Al_xO$), hafnium zirconium oxide ($Hf_{1-x}Zr_xO$, HZO), hafnium titanium oxide ($Hf_{1-x}Ti_xO$), hafnium tantalum oxide ($Hf_{1-x}Ta_xO$), or the like. Specifically, the ferroelectric layer 90 includes HfZrO, HfAlO, HfLaO, HfCeO, HfO, HfGdO, HfSiO or a combination thereof. In some embodiments, the method of forming the ferroelectric layer 90 includes performing a suitable deposition technique, such as CVD, PECVD, metal oxide chemical vapor deposition (MOCVD), ALD, RPALD, PEALD, MBD or the like.

In some embodiments, the ferroelectric layer 90 has a thickness of about 1-20 nm, such as 5-10 nm. Other thickness ranges (e.g., more than 20 nm or 5-15 nm) may be applicable. In some embodiments, the ferroelectric layer 90 is formed in a fully amorphous state. In alternative embodiments, the ferroelectric layer 90 is formed in a partially crystalline state; that is, the ferroelectric layer 90 is formed in a mixed crystalline-amorphous state and having some degree of structural order. In yet alternative embodiments, the ferroelectric layer 90 is formed in a fully crystalline state. In some embodiments, the ferroelectric layer 90 is a single layer. In alternative embodiments, the ferroelectric layer 90 has a multi-layer structure.

Thereafter, an annealing process is performed to the ferroelectric layer 90. The temperature range of the annealing process ranges from about 350° C. to about 450° C. (e.g., 400° C.) in an ambient containing $N_2$, $H_2$, Ar or a combination thereof, so as to achieve a desired crystalline lattice structure for the ferroelectric layer 90. In some embodiments, upon the annealing process, the ferroelectric layer 90 is transformed from an amorphous state to a partially or fully crystalline sate. In alternative embodiments, upon the annealing ferroelectric layer 90 is transformed from a partially crystalline state to a fully crystalline sate.

In some embodiments, the ferroelectric layer 90 is conformally formed on the sidewall of the multi-layer stack 58 and therefore has an uneven and wavy sidewall profile. Specifically, the ferroelectric layer 90 has a wavy profile including multiple separate recesses R from bottom to top, and the recesses R correspond to the conductive layers 72.

Figure 7:
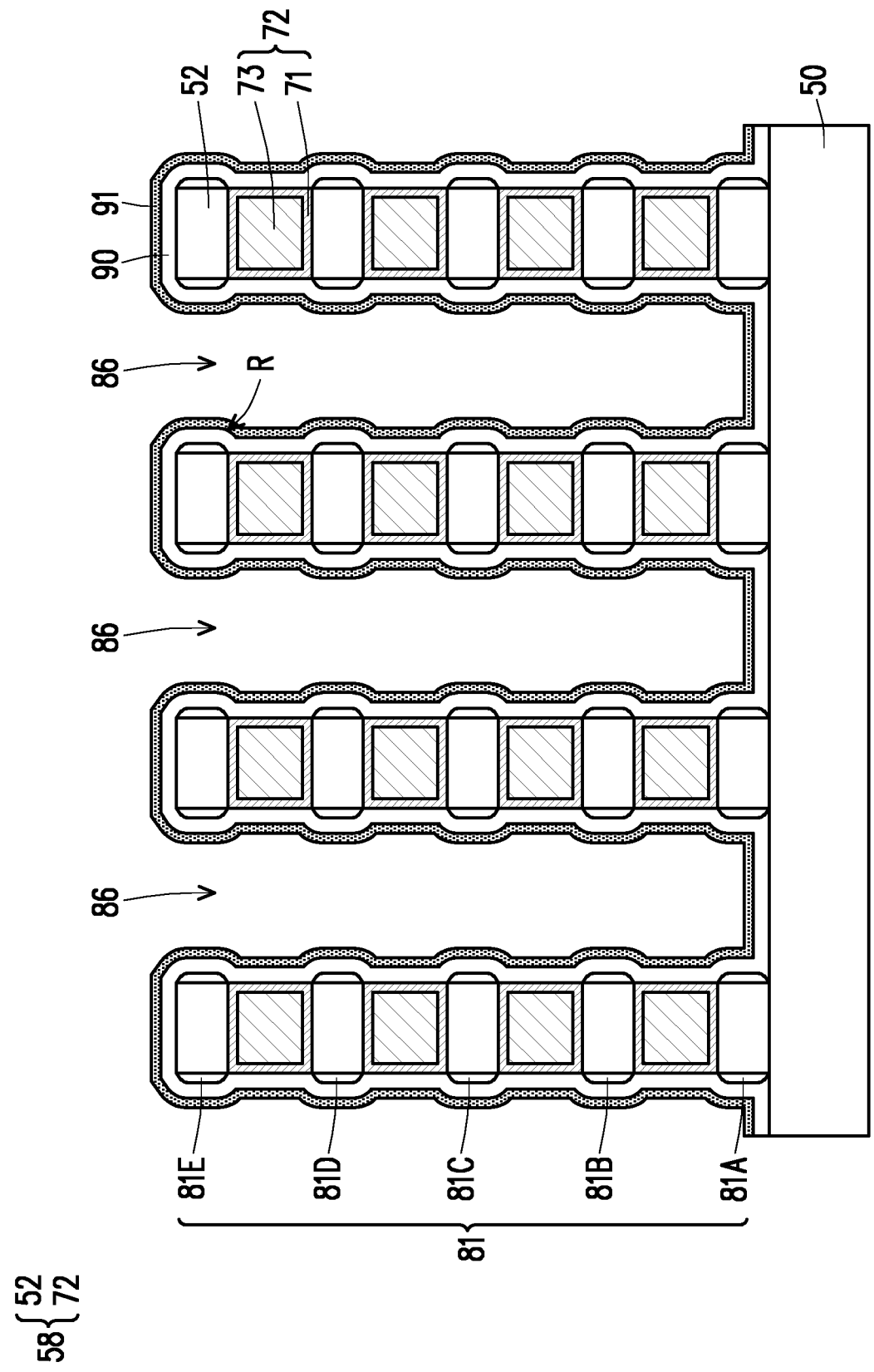

Referring to FIG. 7, a channel material layer 91 is formed on the ferroelectric layer 90. The channel material layer 91 is conformally deposited in the trenches 86 over the ferroelectric layer 90 and fills in the recesses R of the ferroelectric layer 90. The channel material layer 91 includes materials suitable for providing channel layers 92 for the memory cells 100 (see FIG. 9A). For example, the channel material layer 91 includes oxide semiconductor (OS) such as zinc oxide (ZnO), indium tungsten oxide (InWO), indium gallium zinc oxide (InGaZnO, IGZO), indium zinc oxide (InZnO), indium tin oxide (ITO), combinations thereof, or the like. The channel material layer 91 may be deposited by CVD, PVD, ALD, PECVD, or the like. The channel material layer 91 may extend along sidewalls and bottom surfaces of the trenches 86 over the ferroelectric layer 90.

After the channel material layer 91 is deposited, an annealing process is performed to the channel material layer 91. In some embodiments, the annealing process is performed at a temperature of about 300° C. to about 450° C. in oxygen-related ambient, so as to activate the charge carriers of the channel material layer 91.

Figure 8:
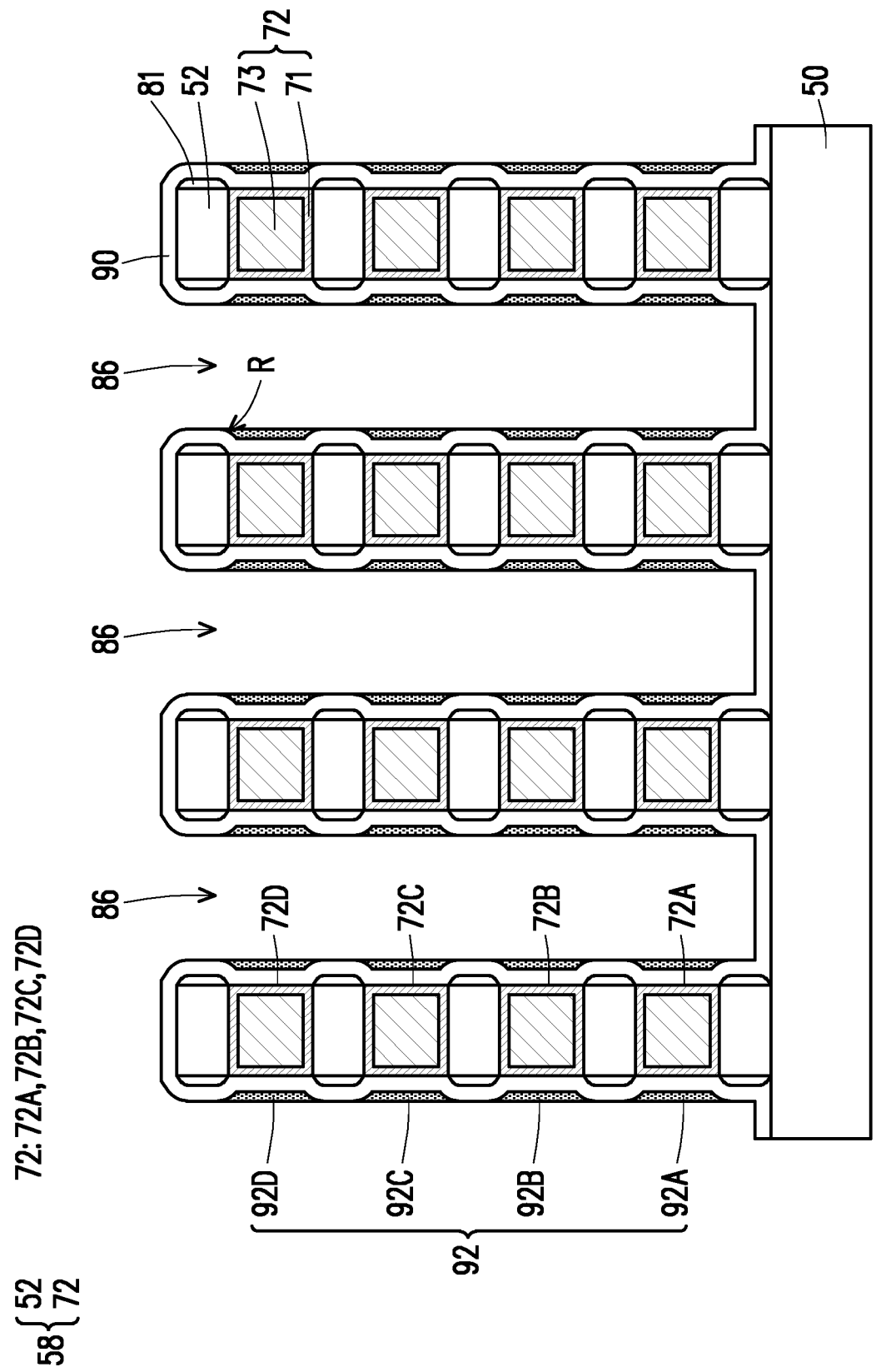

Referring to FIG. 8, the channel material layer 91 is partially removed, such that the remaining channel material layer forms channel layers 92A-92D (collectively referred to as channel layers 92) on the ferroelectric layer 90 and corresponding to the conductive layers 72A-72D (collectively referred to as conductive layers 72), respectively.

In some embodiments, the channel material layer 91 is partially removed by using an etching process. The etching may be anisotropic. In some embodiments, the portions of the channel material layer 91 within the recesses R remain, while the portions the channel material layer 91 outside of the recesses R are removed. In some embodiments, the exposed surfaces of the channel regions 92 are flushed with the exposed surfaces of the ferroelectric layer 90.

Figure 9A:
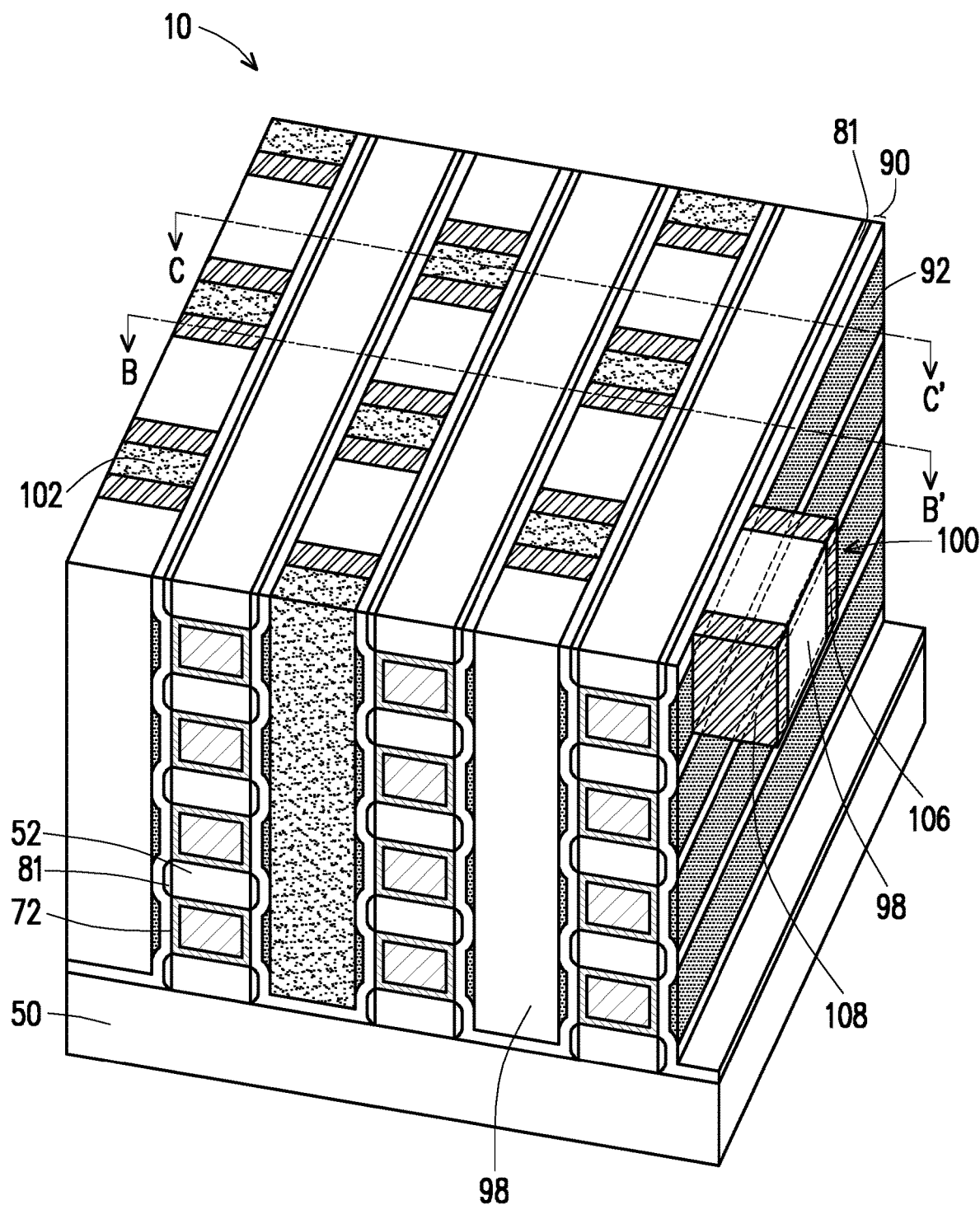
Figure 9B:
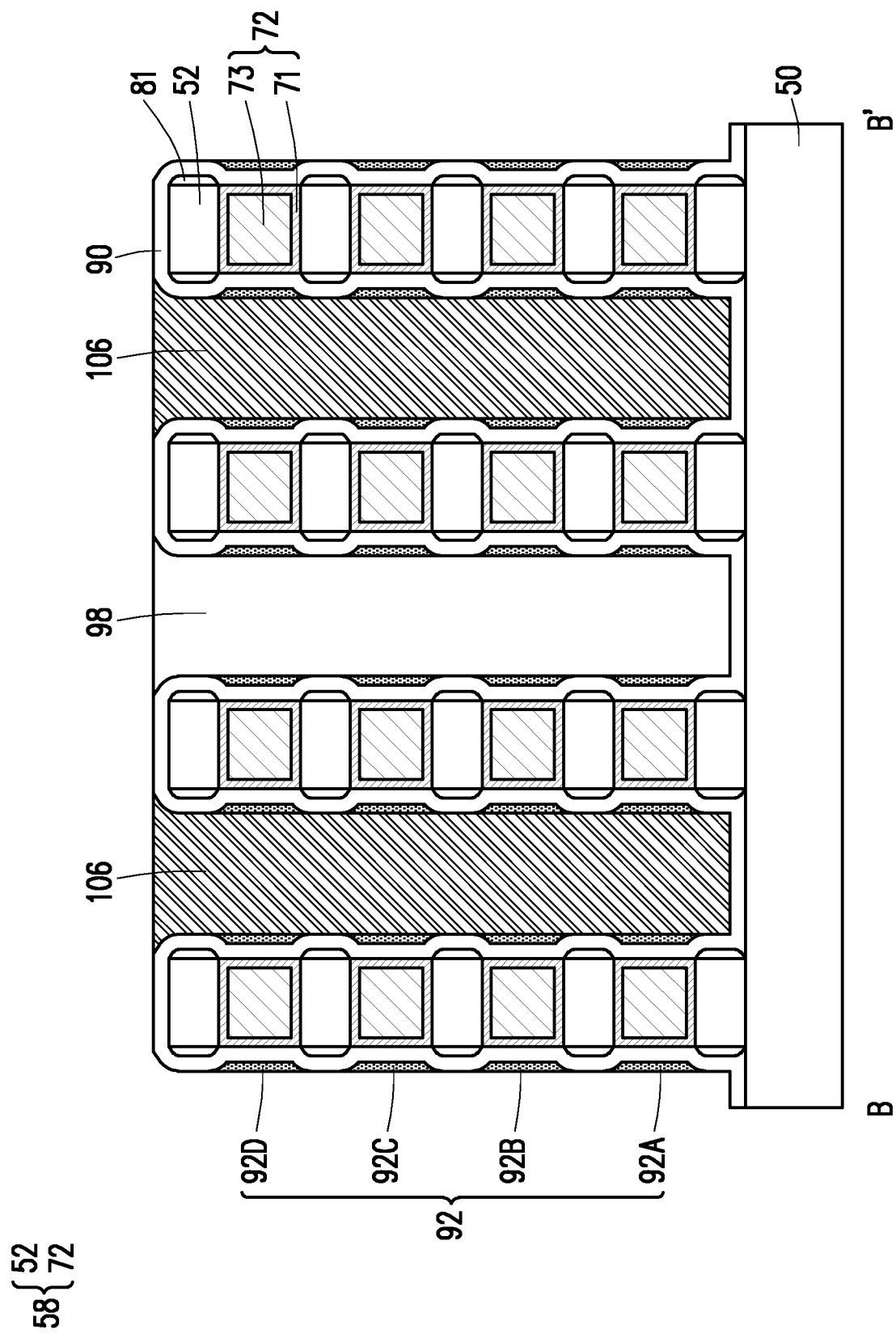
Figure 9C:
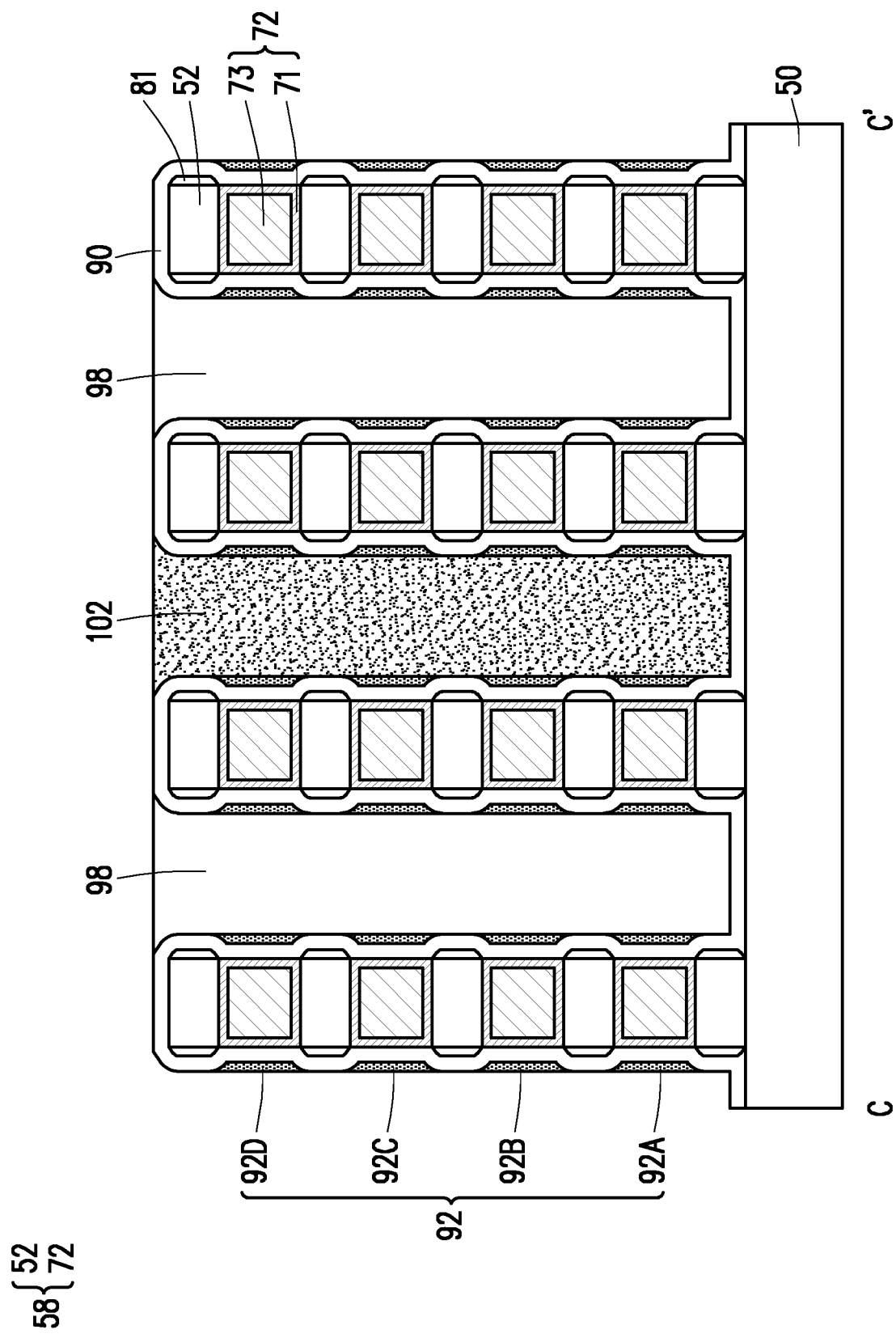
Figure 10:
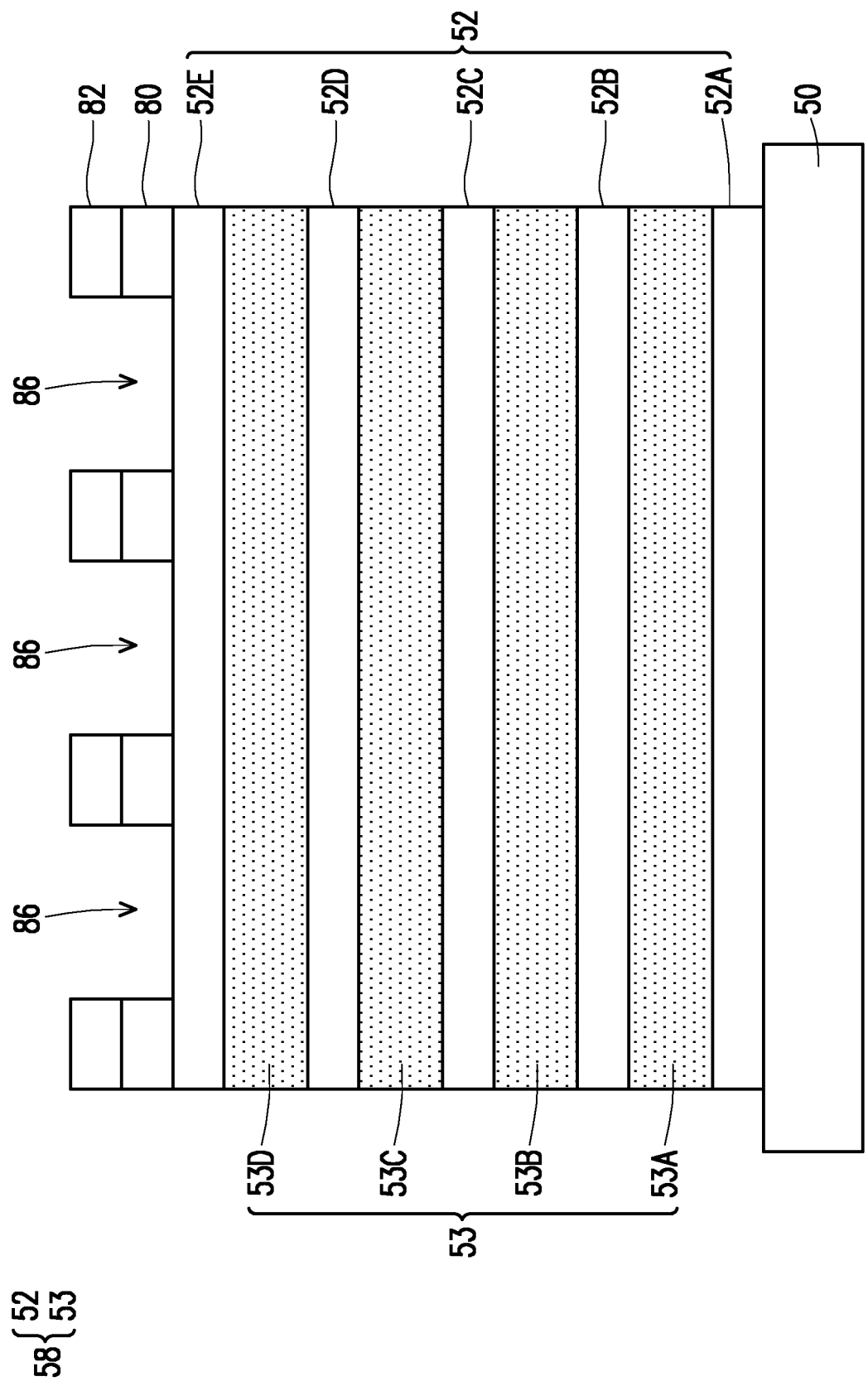
FIGS. 10, 11, 12A, 12B, 13A, 13B, 14, 15, 16, 17, 18A, 18B and 18C illustrate varying views of manufacturing a ferroelectric memory device in accordance with other embodiments.
Figure 11:
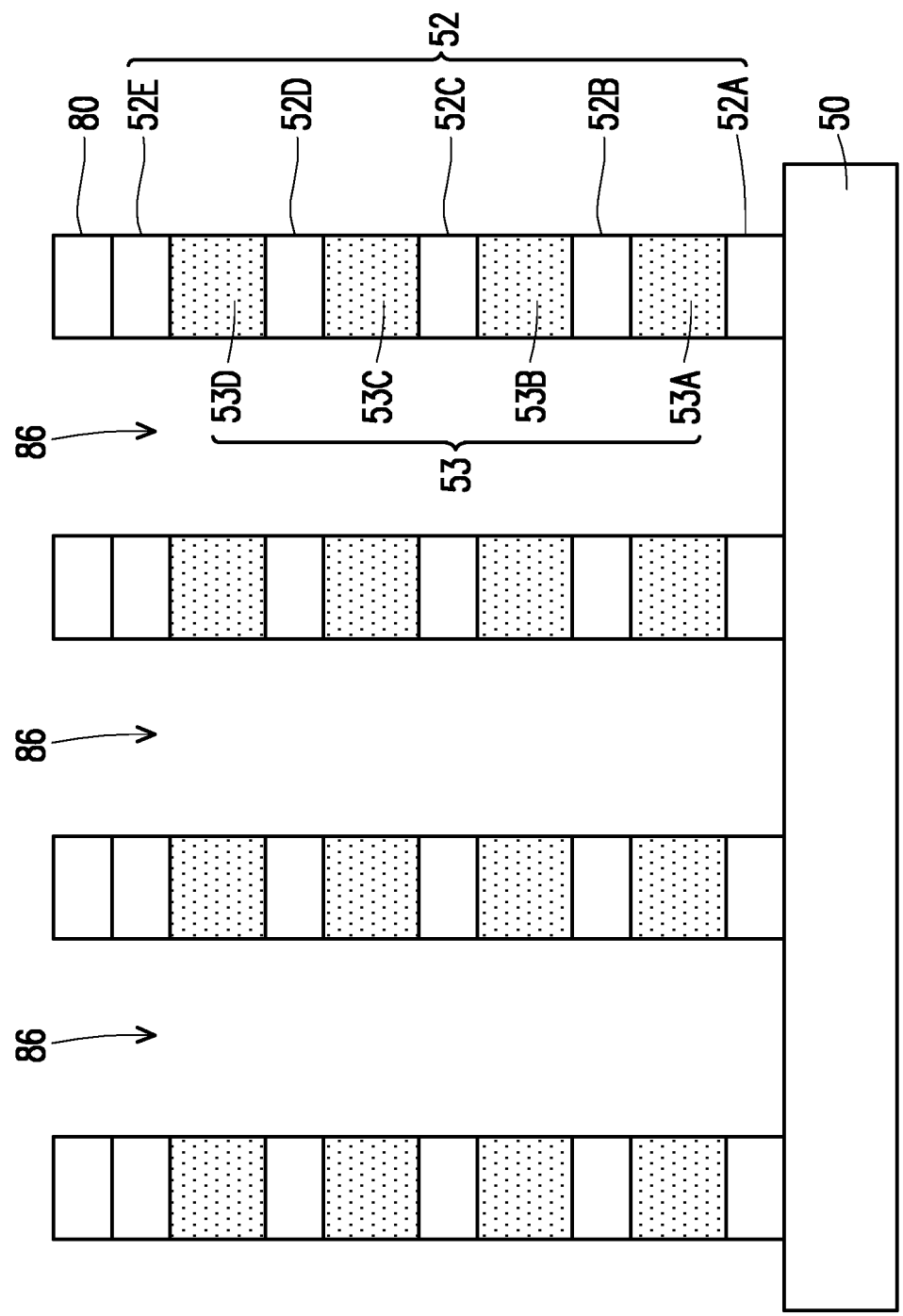

Referring to FIGS. 9A, 9B and 9C, a dielectric layer 98 is deposited in the trenches 86 over the channel layers 92. In some embodiments, the dielectric layer 98 includes silicon oxide, silicon nitride, silicon oxynitride, or the like, which may be deposited by CVD, PVD, ALD, PECVD, or the like.

In some embodiments, isolation pillars 102 are formed through the dielectric layer 98. The isolation pillars 102 may include, for example, silicon oxide, silicon nitride, silicon oxynitride, or the like, which may be formed by suitable combination of etching and deposition and operations. The isolation pillars 102 and the dielectric layer 98 may include different materials. In some embodiments, the dielectric layer 98 include oxide and the isolation pillars 102 include nitride. In some embodiments, the dielectric layer 98 include nitride and the isolation pillars 102 include oxide. Other materials are also possible.

In some embodiments, conductive pillars 106 and 108 are formed through the dielectric layer 98 aside the isolation pillars. The conductive pillars 106 and 108 are arranged alternately in some examples. In some embodiments, one isolation pillar 102 are formed between two adjacent conductive pillars 106 and 108 (e.g., source/drain pillars). The conductive pillars 106 and 108 may extend along a direction perpendicular to the conductive layers 72 such that individual cells of the memory array 10 may be selected for read and write operations. The conductive material may include copper, titanium, titanium nitride, tantalum, tantalum nitride, tungsten, ruthenium, aluminum, combinations thereof, or the like, which may be formed by suitable combination of etching and deposition and operations. In the resulting structure, top surfaces of the multi-layer stack 58 (e.g., the dielectric layer 52E), the ferroelectric layer 90, the conductive pillars 106, and the conductive pillars 108 may be substantially level (e.g., within process variations). In some embodiments, the conductive pillars 106 correspond to and are electrically connected to the bit lines in the memory array, and the conductive pillars 108 correspond to correspond to and are electrically connected to the source lines in the memory array 10.

Thus, stacked memory cells 100 may be formed in the memory array 10, as shown in FIG. 9A. Each memory cell 100 includes a gate electrode/gated region (e.g., a portion of a corresponding conductive layer 72), a gate dielectric (e.g., a portion of a corresponding ferroelectric layer 90), a channel region (e.g., a channel layer 92 corresponding to the gate electrode), and source/drain pillars (e.g., portions of corresponding conductive pillars 106 and 108). The isolation pillars 102 isolates adjacent memory cells 100 in a same column and at a same vertical level. The memory cells 100 may be disposed in an array of vertically stacked rows and columns.

Although the embodiments of FIGS. 1 through 9C illustrate a particular pattern for the conductive pillars 106 and 108, other configurations are also possible. For example, in these embodiments, the conductive pillars 106 and 108 have a staggered pattern. However, in other embodiments, the conductive pillars 106 and 108 in a same row of the array are all aligned with each other.

In the disclosure, the channel regions of the memory array are provided at gated regions only while removed from ungated regions. Therefore, the leakage current of such memory array is significantly reduced.

The inventive concept of discontinuous channel layer can be modified. FIGS. 10, 11, 12A, 12B, 13A, 13B, 14, 15, 16, 17, 18A, 18B and 18C illustrate varying views of manufacturing a ferroelectric memory device in accordance with other embodiments. Similar elements are labeled as similar reference numerals. The difference between embodiments is described in details below, and the similarity between embodiments is omitted herein.

Referring to FIG. 10, FIG. 11, FIG. 12A and FIG. 12B, one or more multi-layer stacks 58 are provided on a substrate 50. Each of the multi-layer stack 58 includes alternating layers of sacrificial layers 53A-53D (collectively referred to as sacrificial layers 53) and dielectric layers 52A-52E (collectively referred to as dielectric layers 52). The materials and forming methods of elements of FIG. 10 to FIG. 12B are similar to those described in FIG. 1 to FIG. 3B, so details are not iterated herein.

Figure 12A:
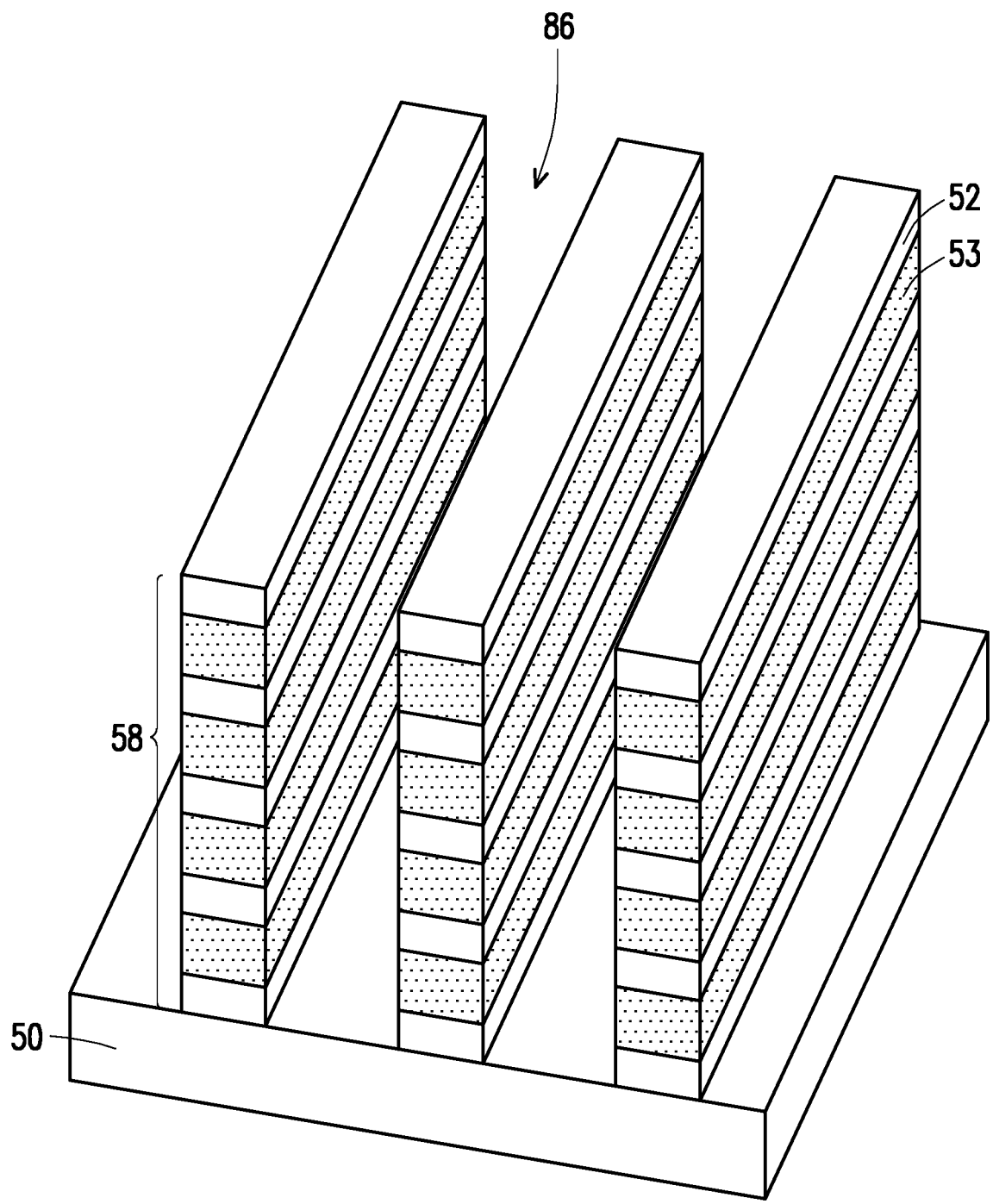
Figure 12B:
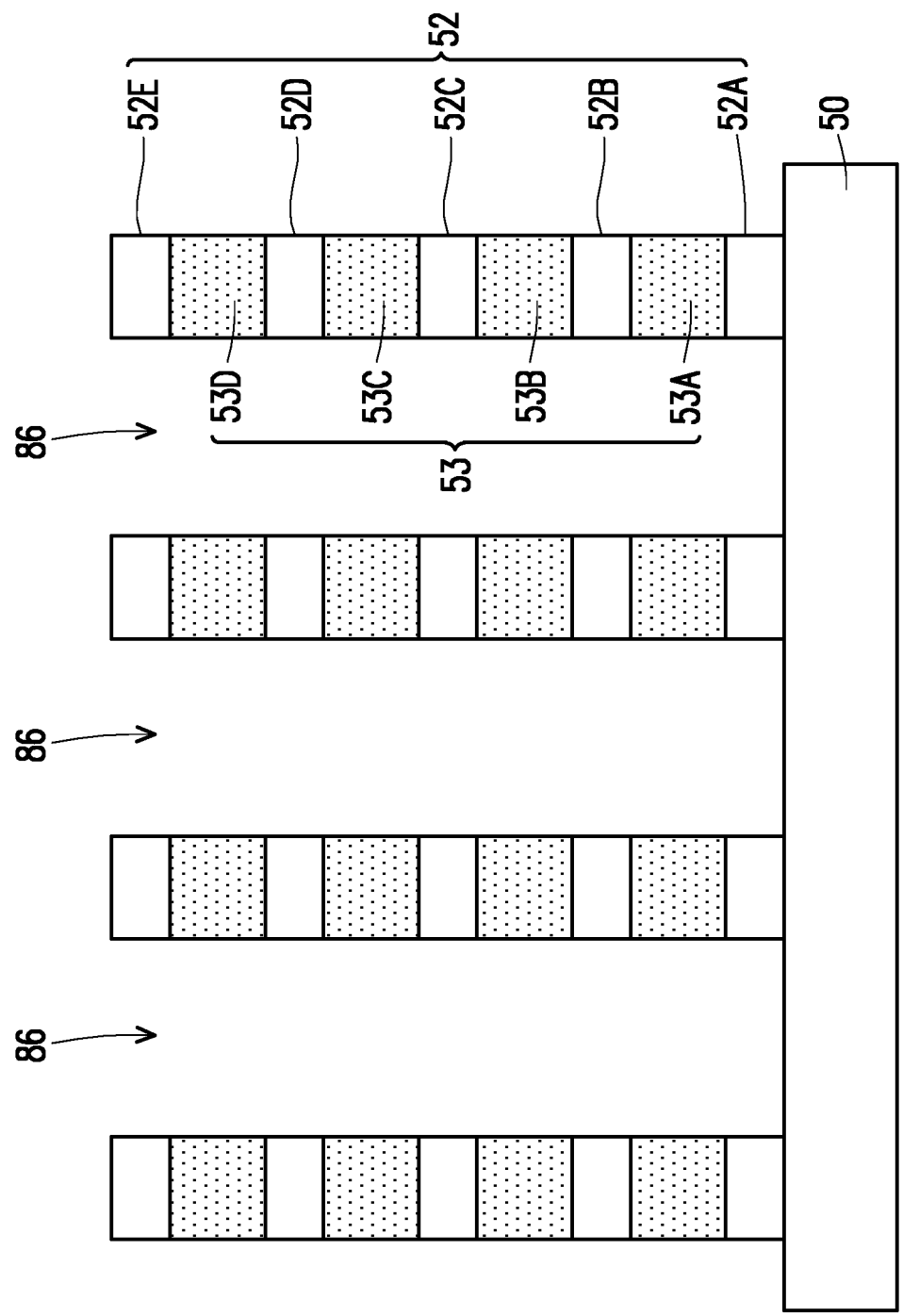
Figure 13A:
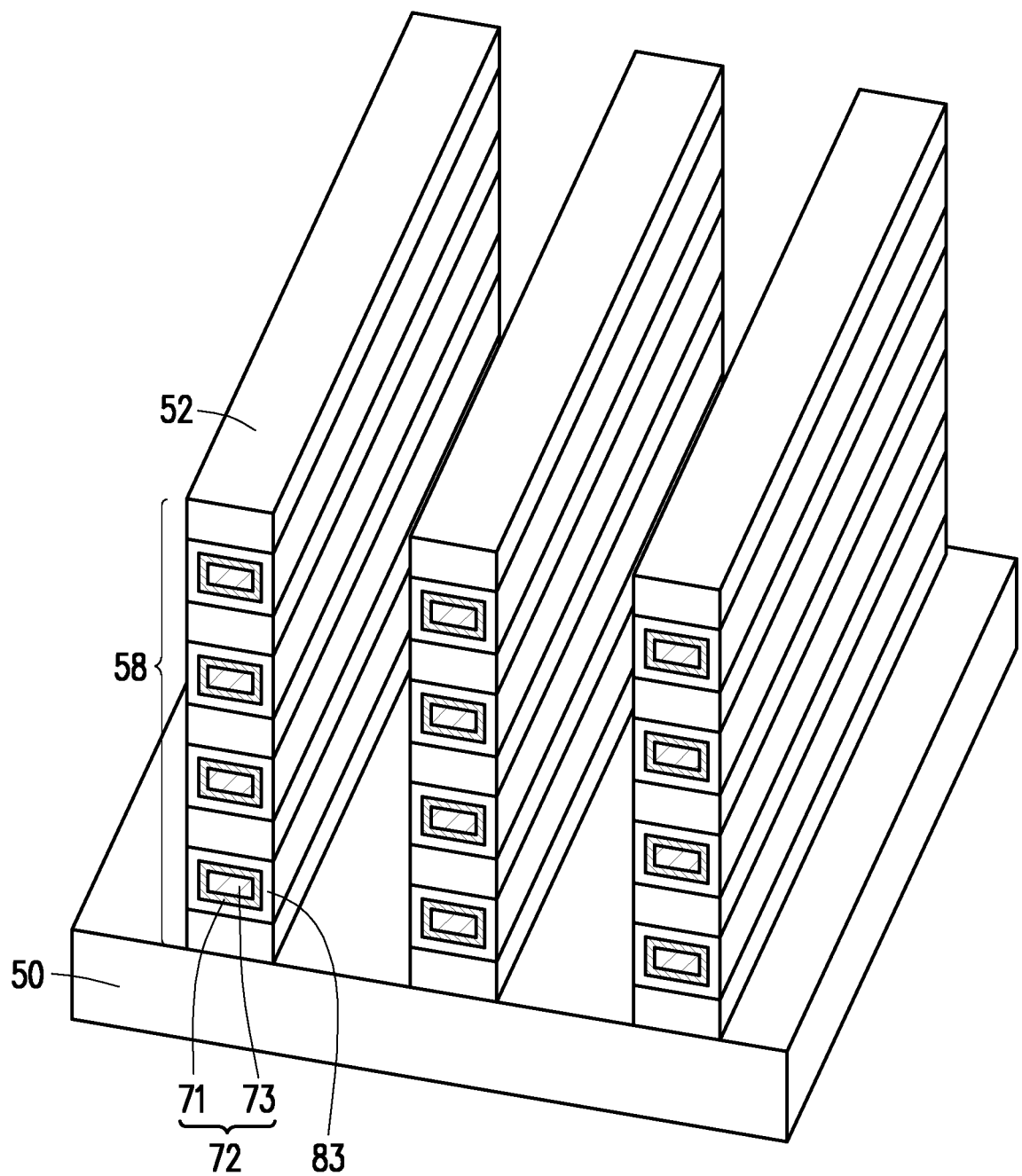
Figure 13B:
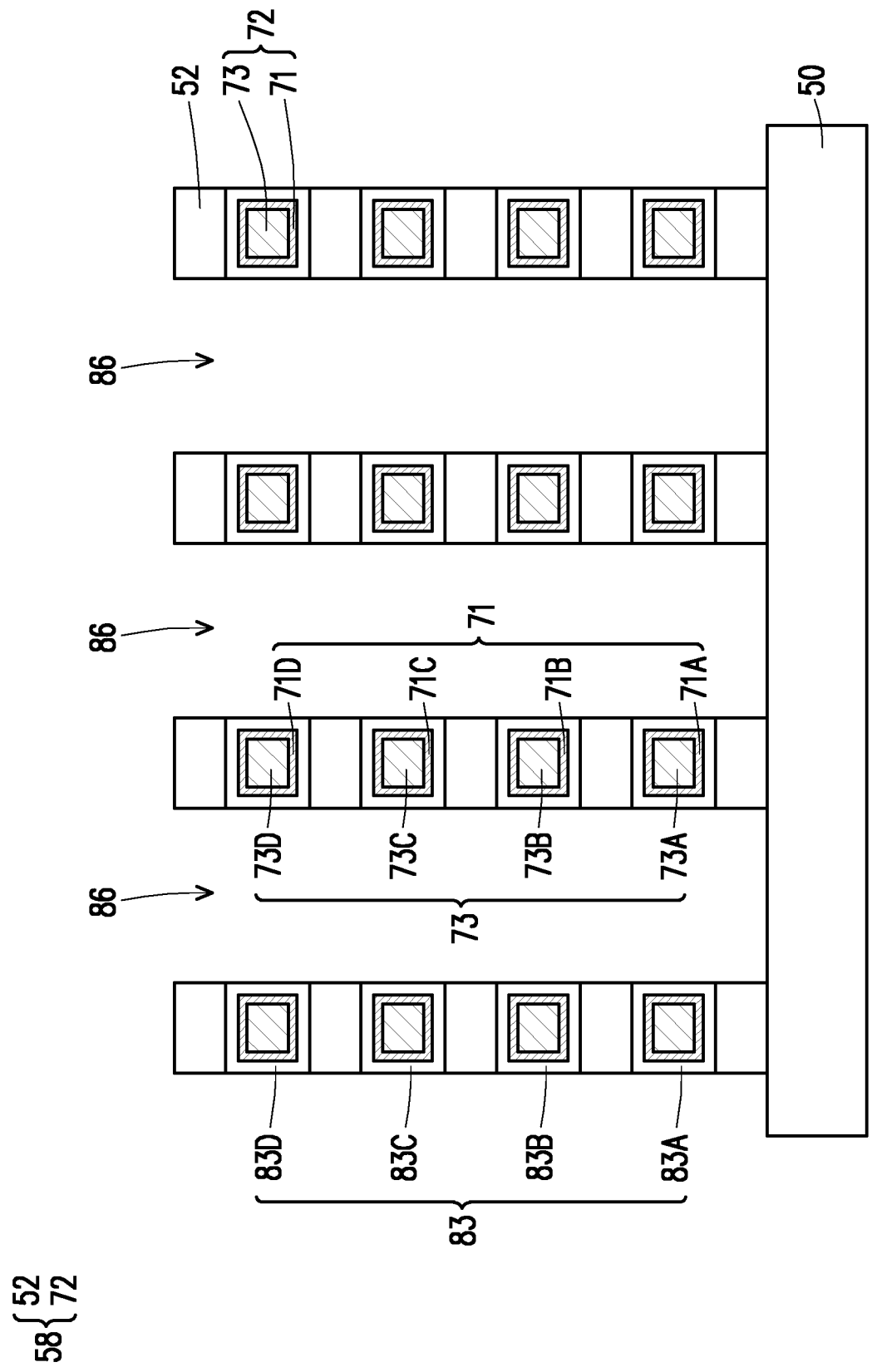

Referring to 12A, FIG. 12B, FIG. 13A and FIG. 13B, the sacrificial layers 53A-53D (collectively referred to as sacrificial layers 53) are replaced with conductive layers 72A-72D (collectively referred to as conductive layers 72). The replacement process includes performing suitable combination of deposition and etching operations. In some embodiments, each conductive layer 72 includes a metal layer 73 (e.g., W, Ru, Co, Cu, Al, Ni, Au, Ag etc.) surrounded by a barrier layer 71 (e.g., Ti, TiN, Ta, TaN, etc.).

In some embodiments, liner layers 83A-83D (collectively referred to as liner layers 83) are formed before the barrier layers 71A-71D (collectively referred to as liner layers 71) are formed. The liner layers 83 include silicon nitride (SiN), silicon carbide (SiC), metal oxide (e.g., $HfO_2$, $Al_2O_3$, etc.), the like or a combination thereof. Specifically, each conductive layer 72 is surrounded by a liner layer 83, and sidewall of the liner layer 83 is exposed to the adjacent trenches 86. In some embodiments, the liner layers 83 have a thickness of about 1-15 nm, such as 5-10 nm. Other thickness ranges (e.g., more than 15 nm) may be applicable.

Figure 14:
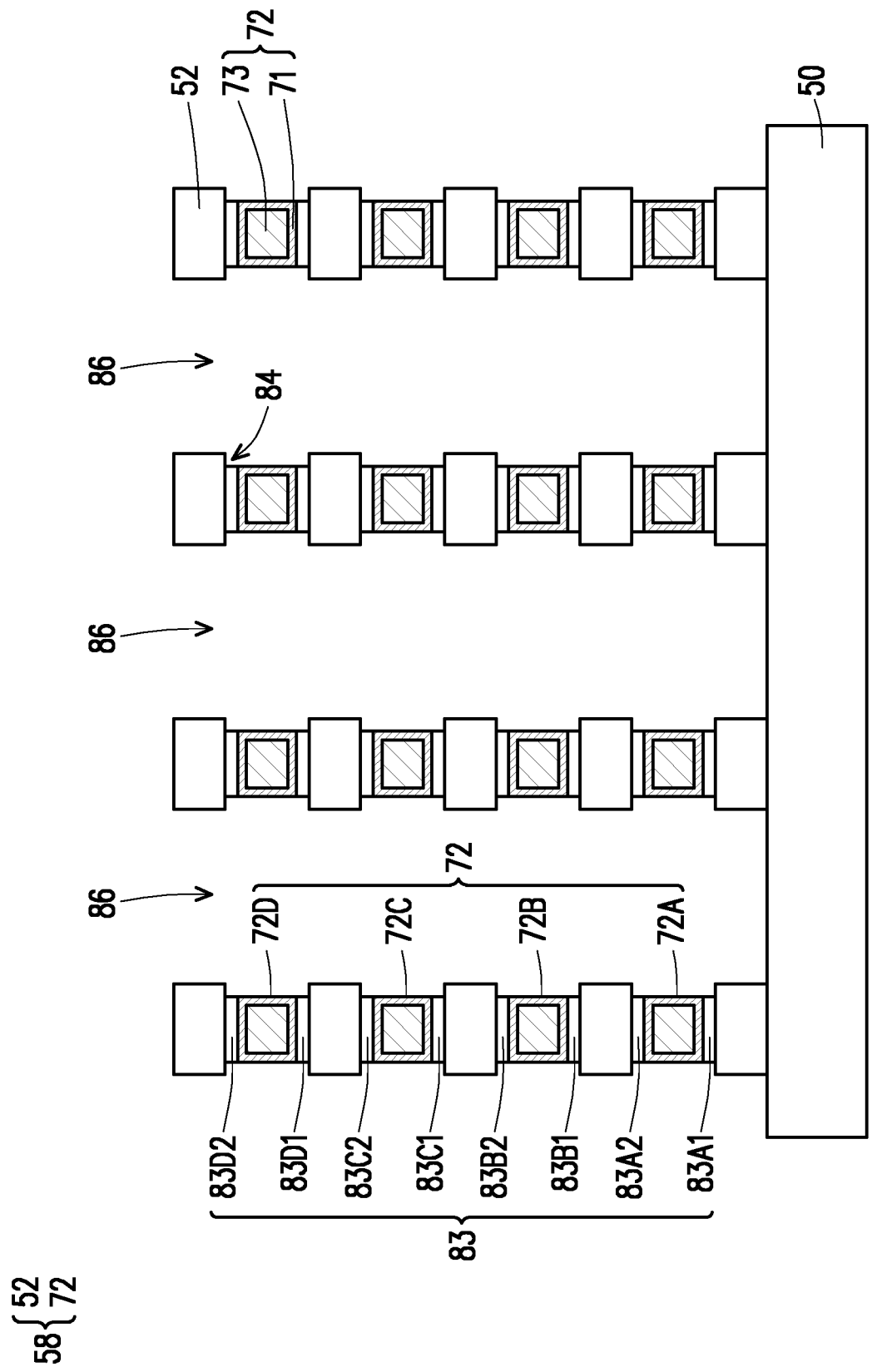

Referring to FIG. 14, the liner layers 83 are partially removed, so that a recess 84 is formed between the two adjacent dielectric layers 52. The recesses 84 are connected to (e.g., in spatial communication with) the corresponding trenches 86. Specifically, the lateral portions of each liner layer 83 remain between the dielectric layer 52 and the adjacent barrier layer 71, while the vertical portions of each liner layer 83 are removed. Accordingly, the recesses 84 expose the sidewalls of the barrier layers 71. In some embodiments, the recesses 84 further expose the sidewalls of the metal layers 73. In some embodiments, the partial removing process includes an etching process, such as a lateral etching. The etching may be anisotropic. In some embodiments, the operation of partially removing the liner layers 83 includes performing a selective etching process. Accordingly, the multi-layer stack 58 has a curvy sidewall. Specifically, the ends of the dielectric layers 52 are protruded from the ends of the conductive layers 72.

Upon the partial removing process, the conductive layer 72A is sandwiched by two liner layers 83A1 and 83A2, the conductive layer 72B is sandwiched by two liner layers 83B1 and 83B2, the conductive layer 72C is sandwiched by two liner layers 83C1 and 83C2 and the conductive layer 72D is sandwiched by two liner layers 83D1 and 83D2.

Figure 15:
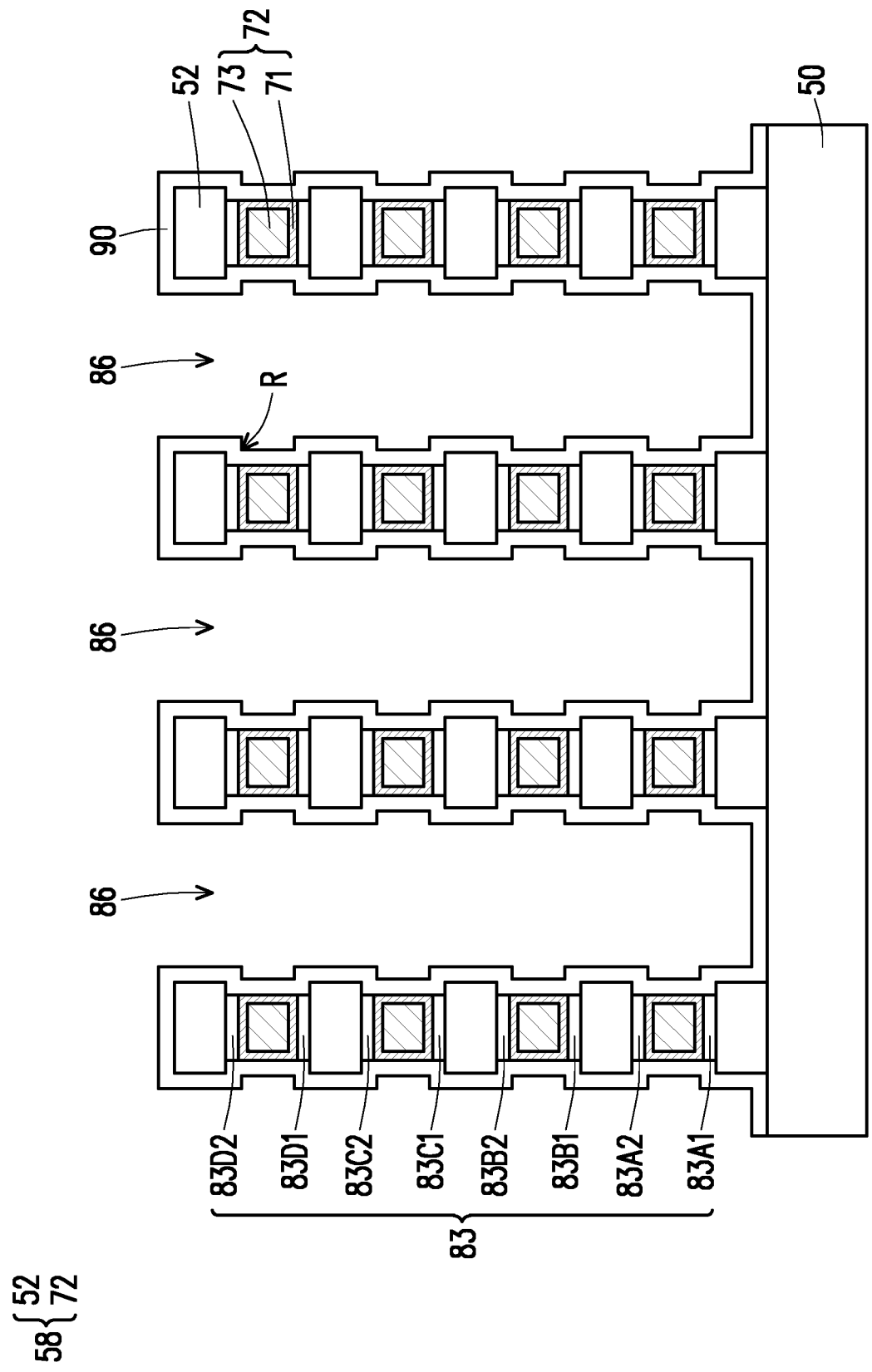

Referring to FIG. 15, a ferroelectric layer 90 is conformally formed on the sidewall of the multi-layer stack 58 and therefore has an uneven and wavy sidewall profile. Specifically, the ferroelectric layer 90 has a wavy profile including multiple separate recesses R from bottom to top, and the recesses R correspond to the conductive layers 72. The material and forming method of the ferroelectric layer 90 of FIG. 15 are similar to the ferroelectric layer 90 described in FIG. 6, so details are not iterated herein.

Figure 16:
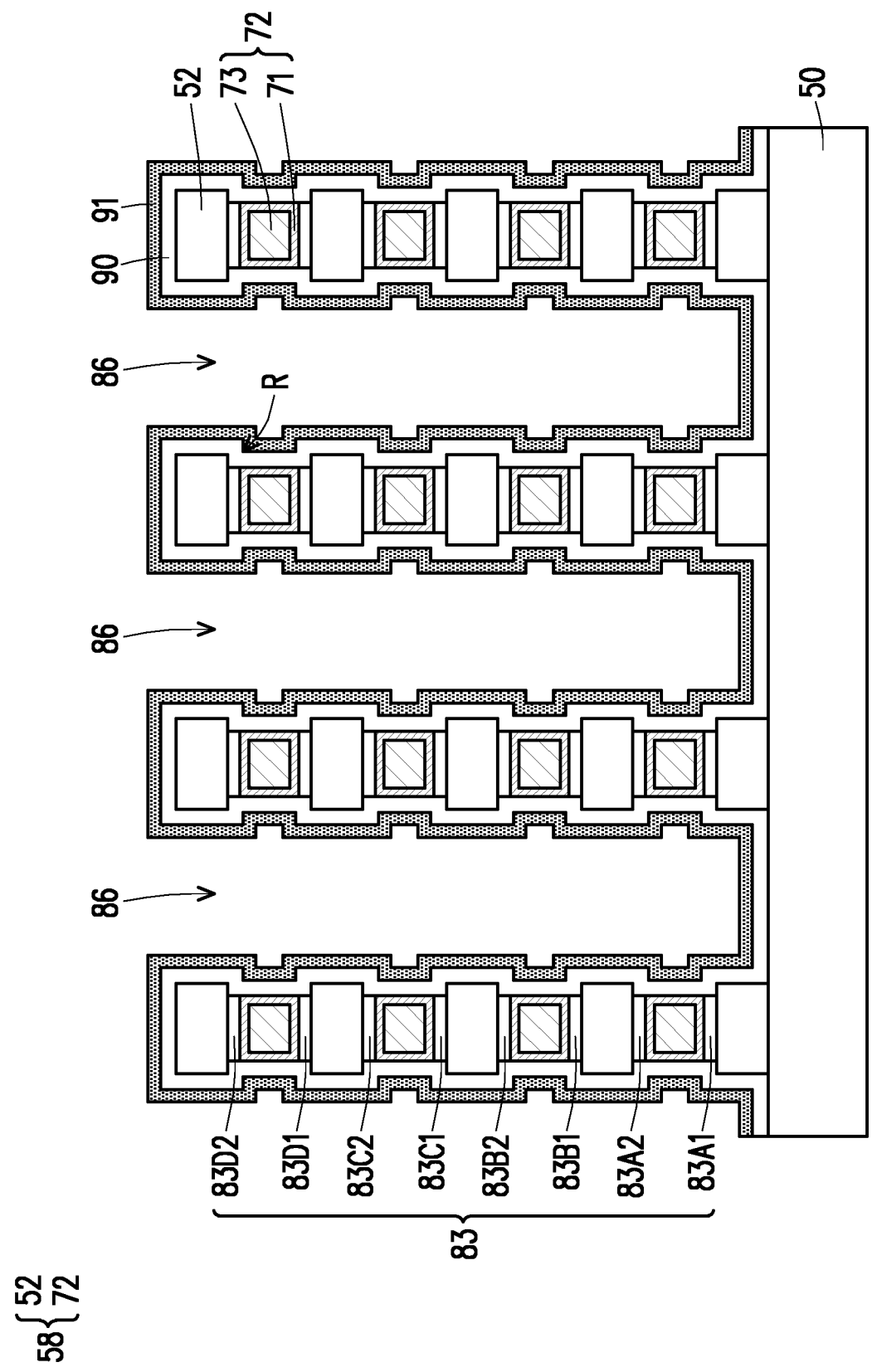

Referring to FIG. 16, a channel material layer 91 is formed on the ferroelectric layer 90. The channel material layer 91 is conformally deposited in the trenches 86 over the ferroelectric layer 90 and fills in the recesses R of the ferroelectric layer 90. The material and forming method of the channel material layer 91 of FIG. 16 are similar to the ferroelectric layer 90 described in FIG. 7, so details are not iterated herein.

Figure 17:
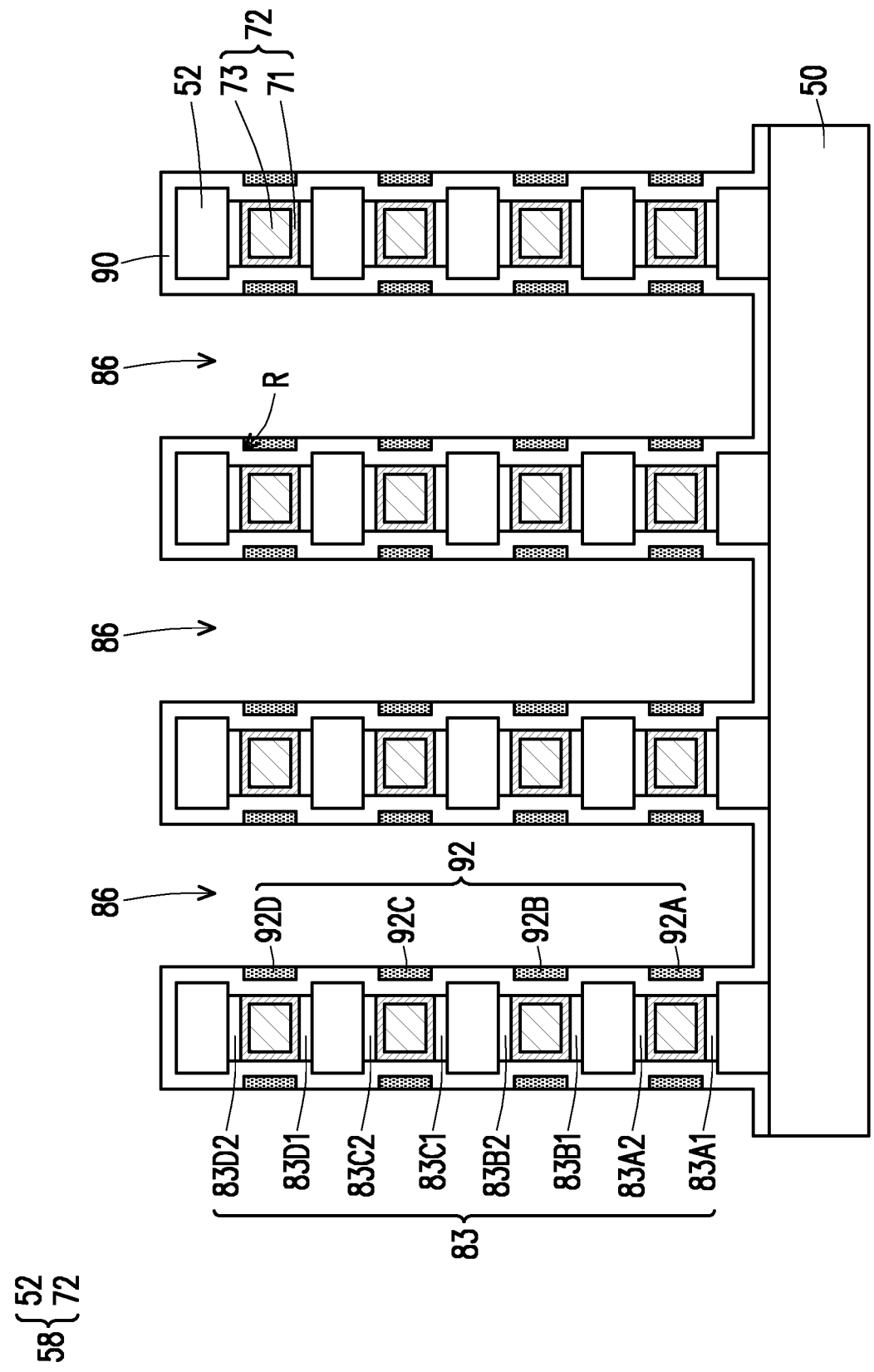

Referring to FIG. 17, the channel material layer 91 is partially removed, such that the remaining channel material layer forms channel layers 92A-92D (collectively referred to as channel layers 92) on the ferroelectric layer 90 and corresponding to the conductive layers 72A-72D (collectively referred to as conductive layers 72), respectively. The partial removing of the channel material layer 91 of FIG. 17 are similar to those described in FIG. 8, so details are not iterated herein.

Figure 18A:
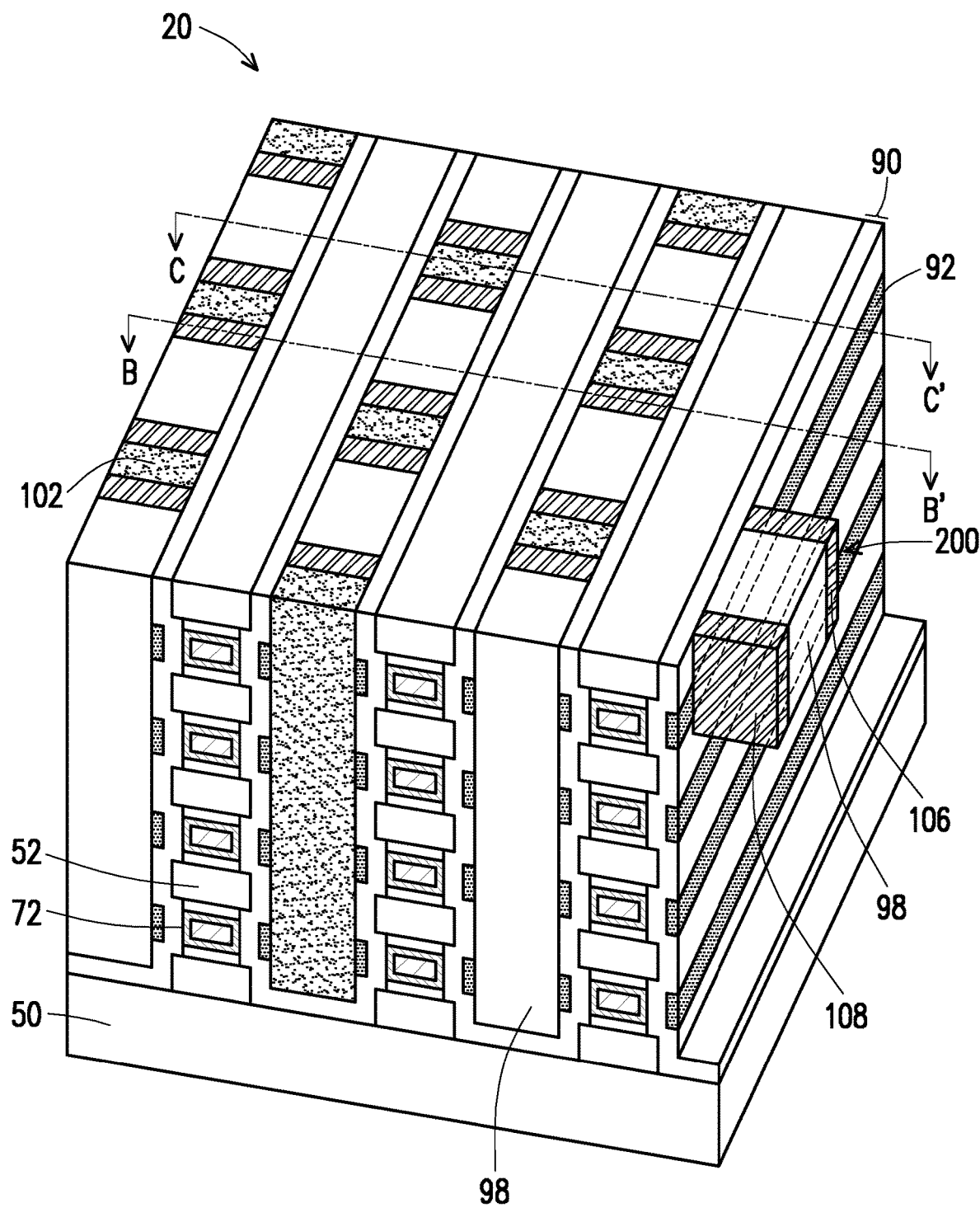
Figure 18B:
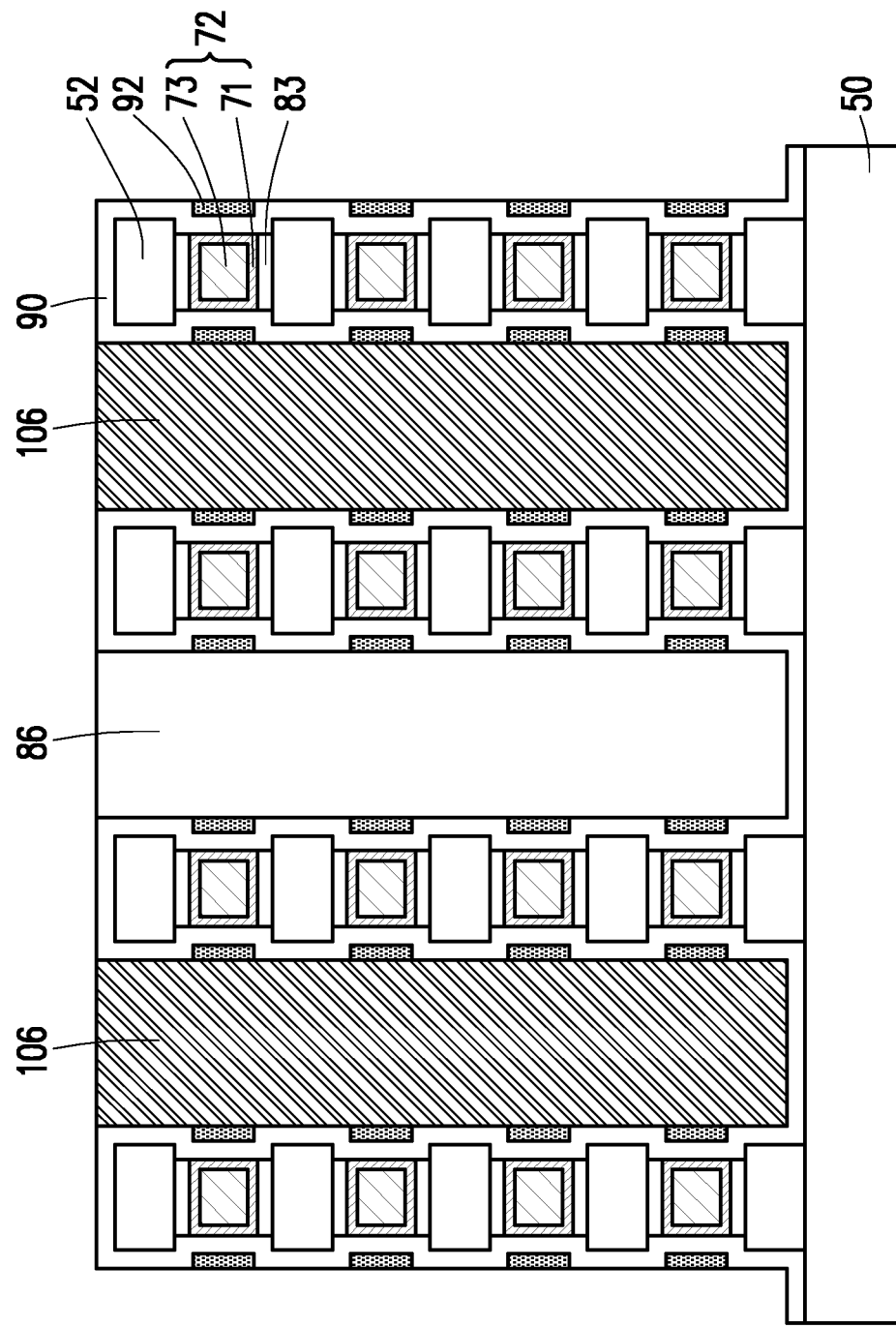
Figure 18C:
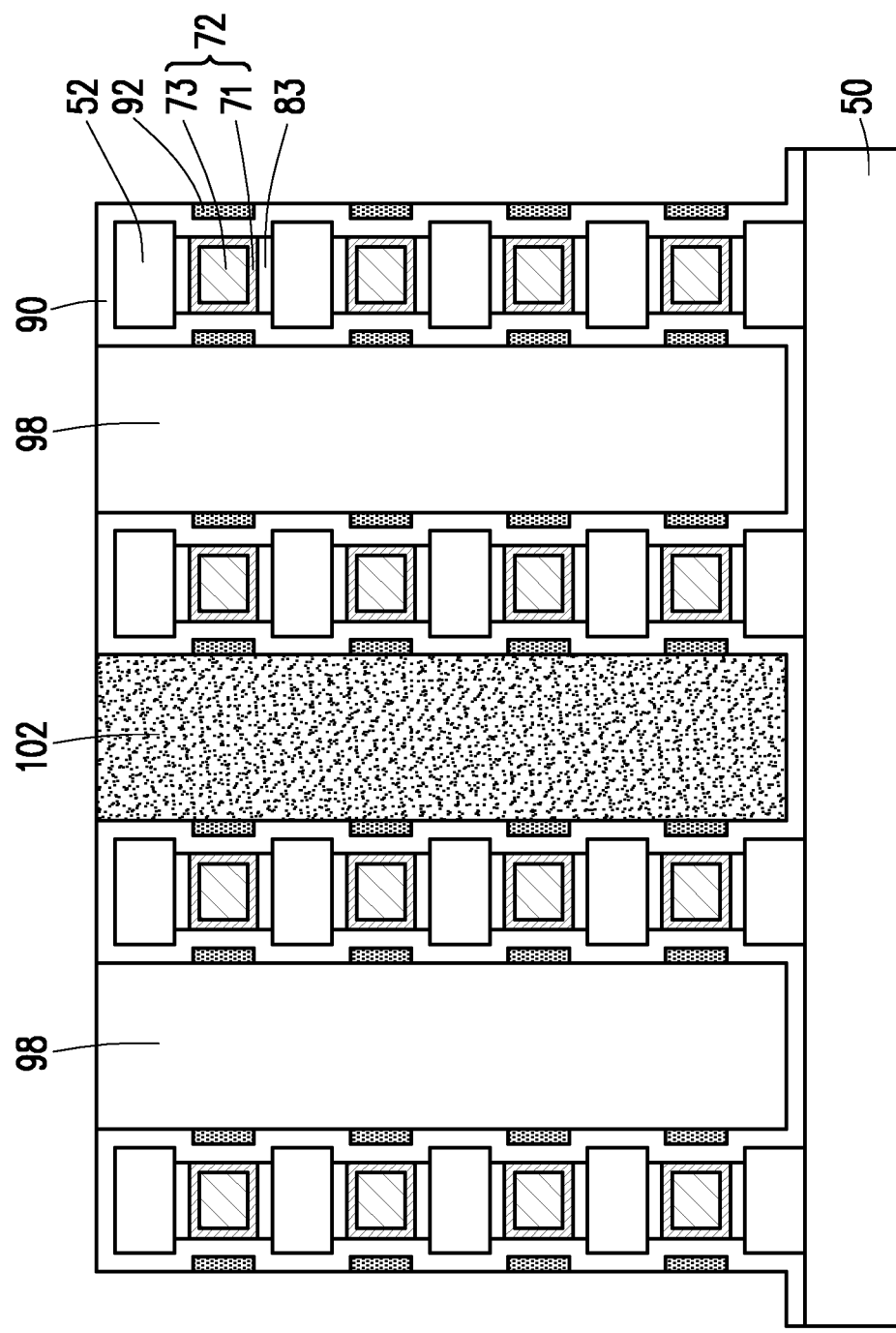

Referring to FIGS. 18A, 18B and 18C, a dielectric layer 98 is deposited in the trenches 86 over the channel layers 92. In some embodiments, isolation pillars 102 are formed through the dielectric layer 98. In some embodiments, conductive pillars 106 and 108 are formed through the dielectric layer 98 aside the isolation pillars 102. In some embodiments, one isolation pillar 102 are formed between two adjacent conductive pillars 106 and 108 (e.g., source/drain pillars). The conductive pillars 106 and 108 may extend along a direction perpendicular to the conductive layers 72 such that individual cells of the memory array 20 may be selected for read and write operations. In the resulting structure, top surfaces of the multi-layer stack 58 (e.g., the dielectric layer 52E), the ferroelectric layer 90, the conductive pillars 106, and the conductive pillars 108 may be substantially level (e.g., within process variations). In some embodiments, the conductive pillars 106 correspond to and are electrically connected to the bit lines in the memory array, and the conductive pillars 108 correspond to correspond to and are electrically connected to the source lines in the memory array 20.

Thus, stacked memory cells 200 may be formed in the memory array 20, as shown in FIG. 18A. Each memory cell 200 includes a gate electrode/gated region (e.g., a portion of a corresponding conductive layer 72), a gate dielectric (e.g., a portion of a corresponding ferroelectric layer 90), a channel region (e.g., a channel layer 92 corresponding to the gate electrode), and source/drain pillars (e.g., portions of corresponding conductive pillars 106 and 108). The isolation pillars 102 isolates adjacent memory cells 200 in a same column and at a same vertical level. The memory cells 200 may be disposed in an array of vertically stacked rows and columns.

Although the embodiments of FIGS. 10 through 18C illustrate a particular pattern for the conductive pillars 106 and 108, other configurations are also possible. For example, in these embodiments, the conductive pillars 106 and 108 have a staggered pattern. However, in other embodiments, the conductive pillars 106 and 108 in a same row of the array are all aligned with each other.

In the disclosure, the channel regions of the memory array are provided at gated regions only while removed from ungated regions. Therefore, the leakage current of such memory array is significantly reduced.

The structures of the ferroelectric memory devices of the disclosure are described below with reference to FIG. 1 to FIG. 18C.

In some embodiments of the present disclosure, a ferroelectric memory device (e.g., memory array 10/20) includes a multi-layer stack 58, a ferroelectric layer 90, and channel layers 92. The multi-layer stack 58 is disposed on a substrate 50 and includes conductive layers 72 and dielectric layers 52 stacked alternately. The ferroelectric layer 90 has a curvy profile and is disposed along sidewalls of the conducive layers 72 and sidewalls of the dielectric layers 52. The channel layers 92 are separated from each other and disposed on the ferroelectric layer 90, and correspond to the conductive layers 72 respectively. In some embodiments, surfaces of the channel layers 92 are flushed with a surface of the ferroelectric layer 90.

In some embodiments, the ferroelectric memory device (e.g., memory array 10) further includes a plurality of cap layers 81, wherein each of the cap layers 81 is disposed between one of the dielectric layers 52 and the ferroelectric layer 90. The cap layers 81 are regarded as part of the multi-layer stack 58 in some examples. In some embodiments, each of the cap layers 81 includes silicon oxide, silicon oxynitride, silicon oxycarbide or a combination thereof.

In some embodiments, the sidewalls the conductive layers 72 are recessed from the sidewalls of the dielectric layers 52. In some embodiments, the ferroelectric memory device (e.g., memory array 20) further includes a plurality of liner layers 83, wherein each of the liners layers 83 is disposed between one of the conductive layers 72 the adjacent dielectric layer 52. The liner layers 83 are regarded as part of the multi-layer stack 58 in some examples. In some embodiments, each of the liner layers 83 include silicon nitride, silicon carbide, metal oxide or a combination thereof.

In some embodiments of the present disclosure, a ferroelectric memory device (e.g., memory array 10) includes a multi-layer stack 58, cap layers 81, a ferroelectric layer 90 and channel layers 92. The multi-layer stack 58 is disposed on a substrate 50 and includes conductive layers 72 and dielectric layers 52 stacked alternately. The cap layers 81 have curved surfaces and cover the sidewalls of the dielectric layers 52 of the multi-layer stack 58 respectively. The ferroelectric layer 90 is disposed along the sidewalls of conducive layers 72 and sidewalls of the cap layers 81. The channel layers 92 are disposed on the ferroelectric layer 90 and correspond to the conductive layers 72 respectively.

In some embodiments, each of the conductive layers 72 includes a metal layer 73 surrounded by a barrier layer 71. In some embodiments, each of the conductive layers 72 includes a metal layer 73 sandwiched by two barrier layers 71.

In some embodiments, each of the cap layers 81 is further in contact with a portion of an adjacent conductive layer 72. Specifically, each of the cap layers 81 is in contact with the barrier layers 71 and/or conductive layers 73 of the adjacent conductive layers 72. In some embodiments, each of the cap layers 81 has a tapered end portion. In some embodiments, each of the cap layers 81 includes silicon oxide, silicon oxynitride, silicon oxycarbide or a combination thereof. In some embodiments, each of the cap layers 81 has a thickness of about 1-15 nm. In some embodiments, each of the channel layers 92 has a tapered end portion. In some embodiments, each of the channel layers includes zinc oxide, indium tungsten oxide, indium gallium zinc oxide, indium zinc oxide, indium tin oxide, or a combination thereof. The cap layers 81 and the channel layers 92 are arranged alternately along the vertical direction.

In some embodiments of the present disclosure, a ferroelectric memory device (e.g., memory array 20) includes a multi-layer stack 58, a ferroelectric layer 90, liner layers 83 and channel layers 92. The multi-layer stack 58 is disposed on a substrate 50 and includes conductive layers 72 and dielectric layers 52 stacked alternately. Ends of the conductive layers 72 are recessed from ends of the dielectric layers 52. The ferroelectric layer 90 is disposed along the sidewalls of the conducive layers 72 and sidewalls of the dielectric layers 52. The channel layers are separated from each other and disposed on the ferroelectric layer 90, and correspond to the conductive layers 72 respectively.

In some embodiments, each of the conductive layers 72 includes a metal layer 73 surrounded by a barrier layer 71. In some embodiments, each of the conductive layers 72 includes a metal layer 73 sandwiched by two barrier layers 71.

In some embodiments, each of the liner layers 83 include silicon nitride, silicon carbide, metal oxide or a combination thereof. In some embodiments, each of the liner layers 83 has a thickness of about 1-15 nm. In some embodiments, each of the channel layers 92 has a uniform thickness. In some embodiments, each of the channel layers includes zinc oxide, indium tungsten oxide, indium gallium zinc oxide, indium zinc oxide, indium tin oxide, or a combination thereof.

In the disclosure, the channel regions of the memory array are provided at gated regions only while removed from ungated regions. Therefore, the leakage current of such memory array is significantly reduced.

In the above embodiments, the gate electrodes (e.g., word lines) are formed by depositing sacrificial dielectric layers followed by replacing sacrificial dielectric layers with conductive layers. However, the disclosure is not limited thereto. In other embodiments, the gate electrodes (e.g., word lines) may be formed in the first stage without a replacement operation.

Many variations of the above examples are contemplated by the present disclosure. It is understood that different embodiments may have different advantages, and that no particular advantage is necessarily required of all embodiments.

In accordance with some embodiments of the present disclosure, a ferroelectric memory device includes a multi-layer stack, a ferroelectric layer, and channel layers. The multi-layer stack is disposed on a substrate and includes conductive layers and dielectric layers stacked alternately. The ferroelectric layer has a curvy profile and is disposed along sidewalls of the conducive layers and sidewalls of the dielectric layers. The channel layers are separated from each other and disposed on the ferroelectric layer, and correspond to the conductive layers respectively.

In accordance with alternative embodiments of the present disclosure, a ferroelectric memory device includes a multi-layer stack, cap layers, a ferroelectric layer and channel layers. The multi-layer stack is disposed on a substrate and includes conductive layers and dielectric layers stacked alternately. The cap layers have curved surfaces and are in contact with the dielectric layers of the multi-layer stack respectively. The ferroelectric layer is disposed along sidewalls of the conducive layers and sidewalls of the cap layers. The channel layers are disposed on the ferroelectric layer and correspond to the conductive layers respectively.

In accordance with yet alternative embodiments of the present disclosure, a method of forming a ferroelectric memory device includes following operations. A multi-layer stack is formed on a substrate, wherein the multi-layer stack includes dielectric layers and conductive layers stacked alternately and has a trench penetrating therethrough. Cap layers are formed on sidewalls of the dielectric layers. A ferroelectric layer is formed on the sidewalls of the cap layers and sidewalls of the conductive layers. A channel material layer is formed on the ferroelectric layer. The channel material layer is partially removed, such that the remaining channel layer forms separate channel layers on the ferroelectric layer and corresponding to the conductive layers respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A ferroelectric memory device, comprising:
a multi-layer stack, disposed on a substrate and comprising a plurality of conductive layers and a plurality of dielectric layers stacked alternately;
a ferroelectric layer, having a curvy profile and disposed along sidewalls of the plurality of conducive layers and sidewalls of the plurality of dielectric layers; and
a plurality of channel layers, separated from each other, disposed on the ferroelectric layer and corresponding to the plurality of conductive layers respectively,
wherein a sidewall of each channel layer facing away from the corresponding conductive layer is flushed with a sidewall of a portion of the ferroelectric layer facing away from the adjacent dielectric layer.

2. The ferroelectric memory device of claim 1, wherein each of the channel layers has a gradually changing thickness.

3. The ferroelectric memory device of claim 1, further comprising a plurality of cap layers, wherein each of the cap layers is disposed between one of the dielectric layers and the ferroelectric layer.

4. The ferroelectric memory device of claim 3, wherein each of the cap layers comprises silicon oxide, silicon oxynitride, silicon oxycarbide or a combination thereof.

5. The ferroelectric memory device of claim 1, wherein the sidewalls the conductive layers are recessed from the sidewalls of the dielectric layers.

6. The ferroelectric memory device of claim 5, further comprising a plurality of liner layers, wherein each of the liners layers is disposed between one of the conductive layers the adjacent dielectric layer.

7. The ferroelectric memory device of claim 6, wherein each of the liner layers comprises silicon nitride, silicon carbide, metal oxide or a combination thereof.

8. The ferroelectric memory device of claim 1, wherein each of the conductive layers comprises a metal layer surrounded by a barrier layer.

9. The ferroelectric memory device of claim 1, wherein each of the conductive layers comprises a metal layer sandwiched by two barrier layers.

10. A ferroelectric memory device, comprising:
a multi-layer stack, disposed on a substrate and comprising a plurality of conductive layers and a plurality of dielectric layers stacked alternately;
a plurality of cap layers, having curved surfaces and in contact with the dielectric layers of the multi-layer stack respectively;
a ferroelectric layer, disposed along sidewalls of the plurality of conducive layers and sidewalls of the plurality of cap layers; and
a plurality of separate channel layers, disposed on the ferroelectric layer and corresponding to the plurality of conductive layers respectively,
wherein a sidewall of each channel layer facing away from the corresponding conductive layer is flushed with a sidewall of a portion of the ferroelectric layer facing away from the adjacent dielectric layer.

11. The ferroelectric memory device of claim 10, wherein each of the cap layers is further in contact with a portion of an adjacent conductive layer.

12. The ferroelectric memory device of claim 10, wherein each of the cap layers has a tapered end portion and a gradually changing thickness.

13. The ferroelectric memory device of claim 10, wherein each of the cap layers comprises silicon oxide, silicon oxynitride, silicon oxycarbide or a combination thereof.

14. The ferroelectric memory device of claim 10, wherein each of the cap layers has a thickness of about 1-15 nm.

15. The ferroelectric memory device of claim 10, wherein each of the channel layers has a tapered end portion.

16. The ferroelectric memory device of claim 10, wherein each of the channel layers comprises zinc oxide, indium tungsten oxide, indium gallium zinc oxide, indium zinc oxide, indium tin oxide, or a combination thereof.

17. The ferroelectric memory device of claim 10, wherein each of the conductive layers comprises a metal layer surrounded by a barrier layer.

18. A method of forming a ferroelectric memory device, comprising:
forming a multi-layer stack on a substrate, wherein the multi-layer stack comprises a plurality of dielectric layers and a plurality of conductive layers stacked alternately;
forming a plurality of cap layers having curved surfaces and being in contact with the dielectric layers of the multi-layer stack respectively;
forming a ferroelectric layer along sidewalls of the cap layers and sidewalls of the conductive layers; and
forming a plurality of separate channel layers on the ferroelectric layer and corresponding to the plurality of conductive layers respectively,
wherein a sidewall of each channel layer facing away from the corresponding conductive layer is flushed with a sidewall of a portion of the ferroelectric layer facing away from the adjacent dielectric layer.

19. The method of claim 18, wherein the cap layers are formed by a selective growth process.

20. The method of claim 18, wherein each of the channel layers has a tapered end portion.

* * * * *